(12) United States Patent
Sasada

(10) Patent No.: US 12,409,632 B2
(45) Date of Patent: Sep. 9, 2025

(54) POLYMER FILM AND LAMINATE

(71) Applicant: FUJIFILM Corporation, Tokyo (JP)

(72) Inventor: Yasuyuki Sasada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 179 days.

(21) Appl. No.: 18/317,933

(22) Filed: May 16, 2023

(65) Prior Publication Data

US 2023/0278317 A1 Sep. 7, 2023

Related U.S. Application Data

(63) Continuation of application No. PCT/JP2021/042879, filed on Nov. 24, 2021.

(30) Foreign Application Priority Data

Nov. 24, 2020 (JP) .................... 2020-194651
Nov. 19, 2021 (JP) .................... 2021-188869

(51) Int. Cl.
*B32B 15/09* (2006.01)
*B32B 15/20* (2006.01)
*B32B 27/08* (2006.01)

(52) U.S. Cl.
CPC .......... *B32B 15/09* (2013.01); *B32B 15/20* (2013.01); *B32B 27/08* (2013.01); *B32B 2250/03* (2013.01); *B32B 2305/55* (2013.01)

(58) Field of Classification Search
None
See application file for complete search history.

(56) References Cited

U.S. PATENT DOCUMENTS

| 5,759,674 A | 6/1998 | Furuta et al. | |
|---|---|---|---|
| 6,124,004 A | 9/2000 | Furuta et al. | |
| 2006/0167182 A1* | 7/2006 | Onishi | C08L 23/10 525/240 |
| 2010/0000771 A1* | 1/2010 | Shimauchi | H05K 3/386 442/232 |
| 2020/0281076 A1 | 9/2020 | Nishimura et al. | |
| 2021/0002507 A1 | 1/2021 | Azami et al. | |
| 2021/0332231 A1 | 10/2021 | Miyamoto et al. | |
| 2022/0041932 A1* | 2/2022 | Imamura | C09K 19/38 |

FOREIGN PATENT DOCUMENTS

| JP | H08/323923 A | * | 12/1996 | ............. B32B 15/08 |
|---|---|---|---|---|
| JP | H08323923 | | 12/1996 | |
| JP | H10258491 | | 9/1998 | |
| JP | H10/329270 A | * | 12/1998 | ............. B32B 15/08 |
| JP | H10329270 | | 12/1998 | |
| JP | 2002064030 | | 2/2002 | |
| JP | 2002064030 A | * | 2/2002 | ............. C08L 67/03 |
| JP | 2007098692 | | 4/2007 | |
| JP | 2016117281 | | 6/2016 | |
| JP | 2016117281 A | * | 6/2016 | ............. B32B 15/04 |
| JP | 2019065061 | | 4/2019 | |
| JP | 2019065061 A | * | 4/2019 | ............. B32B 15/08 |
| JP | 2020026474 | | 2/2020 | |
| WO | WO-2016035876 A1 | * | 3/2016 | ............. B32B 15/08 |
| WO | 2019054334 | | 3/2019 | |
| WO | 2019181856 | | 9/2019 | |
| WO | WO-2019188262 A1 | * | 10/2019 | ............. B32B 15/08 |
| WO | 2020059651 | | 3/2020 | |
| WO | 2020218405 | | 10/2020 | |

OTHER PUBLICATIONS

Shechter—glycidyl-ether-reactions-with-alcohols & carboxylic-acids Ind. Eng.Chem.—1956 (Year: 1956).*
Furuta—JP H08-323923 A—PCT D2—MT—LCP polyester film+metal—1996 (Year: 1996).*
Furata—JP H10-329270 A—PCT D5—X ref—MT—LCP polyester+metal—1998 (Year: 1998).*
Yamaguchi—JP 2002-064030 A—PCT D6—X ref—MT—film capacitor—2002 (Year: 2002).*
Thompson—LCP_material_and_transmission_lines_30_to_110_GHz—IEEE Trans. Microwave—2004 (Year: 2004).*
Inoue—WO 2016-035876 A1—MT—clad laminate w—motivation for roughness of foil—2016 (Year: 2016).*
Ito—JP 2016-117281 A—PCT D1—MT—three layer film—2016 (Year: 2016).*
Ori—WO 2019-188262 A1—MT—amino silane treatment copper foil adhesion—2019 (Year: 2019).*
Ozawa—JP 2019-065061 A—PCT D4—MT—resin for circuit board—2019 (Year: 2019).*
Araki—Low_Dielectric_Loss_Polyimide—IEEE ECTC—2020 (Year: 2020).*
"International Search Report (Form PCT/ISA/210) of PCT/JP2021/042879," mailed on Feb. 1, 2022, with English translation thereof, pp. 1-7.
"Written Opinion of the International Searching Authority (Form PCT/ISA/237) of PCT/JP2021/042879," mailed on Feb. 1, 2022, with English translation thereof, pp. 1-9.
"Office Action of Japan Counterpart Application", issued on Jun. 17, 2025, with English translation thereof, pp. 1-9.

* cited by examiner

*Primary Examiner* — John Vincent Lawler
(74) *Attorney, Agent, or Firm* — JCIPRNET

(57) ABSTRACT

Provided are a polymer film having excellent adhesiveness with a substrate, and a laminate using the polymer film. The polymer film includes a layer A and a layer B on at least one surface of the layer A, in which the layer B contains a polymer having a dielectric loss tangent of 0.01 or less or 0.005 or less or a liquid crystal polymer, and a compound having a functional group, and the functional group is at least one group selected from the group consisting of a covalent-bondable group, an ion-bondable group, a hydrogen-bondable group, a dipole-interactable group, and a curing reactive group.

14 Claims, No Drawings

POLYMER FILM AND LAMINATE

CROSS-REFERENCE TO RELATED APPLICATIONS

This application is a continuation application of International Application No. PCT/JP2021/042879, filed Nov. 24, 2021, the disclosure of which is incorporated herein by reference in its entirety. Further, this application claims priority from Japanese Patent Application No. 2020-194651, filed Nov. 24, 2020, and Japanese Patent Application No. 2021-188869, filed Nov. 19, 2021.

BACKGROUND OF THE INVENTION

1. Field of the Invention

The present disclosure relates to a polymer film and a laminate.

2. Description of the Related Art

In recent years, frequencies used in a communication equipment tend to be extremely high. In order to suppress transmission loss in a high frequency band, insulating materials used in a circuit board are required to have a lowered relative permittivity and a lowered dielectric loss tangent.

In the related art, polyimide is commonly used as the insulating material used in the circuit board, a liquid crystal polymer which has high heat resistance and low water absorption and is small in loss in the high frequency band has been attracted.

As a liquid crystal polymer film in the related art, for example, JP2020-26474A discloses a liquid crystalline polyester film that contains at least liquid crystalline polyester, in which, in a case where a first alignment degree is set to an alignment degree with respect to a first direction parallel to a main surface of the liquid crystalline polyester film, and a second alignment degree is set to an alignment degree with respect to a second direction parallel to the main surface and perpendicular to the first direction, a first alignment degree/second alignment degree that is a ratio of the first alignment degree and the second alignment degree is equal to or greater than 0.95 and equal to or less than 1.04, and a third alignment degree of the liquid crystalline polyester that is measured by a wide angle X-ray scattering method in a direction parallel to the main surface is equal to or greater than 60.0%.

In addition, as a functional film in the related art, a film disclosed in WO2019/054334A is known.

WO2019/054334A discloses a high-frequency circuit laminate containing a polymer and a curable compound, in which a resin layer having excellent adhesiveness with a metal layer and a metal foil are laminated with each other.

SUMMARY OF THE INVENTION

An object to be achieved by an aspect of the present invention is to provide a polymer film having excellent adhesiveness with a substrate.

An object to be achieved by another aspect of the present invention is to provide a laminate using the above-described polymer film.

The methods for achieving the above-described objects include the following aspects.

<1> A polymer film comprising:
a layer A; and
a layer B on at least one surface of the layer A,
in which the layer B contains a polymer having a dielectric loss tangent of 0.005 or less and a compound having a functional group, and
the functional group is at least one group selected from the group consisting of a covalent-bondable group, an ion-bondable group, a hydrogen-bondable group, a dipole-interactable group, and a curing reactive group.

<2> The polymer film according to <1>,
in which a melting point Tm or a 5%-by-mass-loss temperature Td of the polymer having a dielectric loss tangent of 0.005 or less is 200° C. or higher.

<3> The polymer film according to <1>,
in which a glass transition temperature Tg of the polymer having a dielectric loss tangent of 0.005 or less is 200° C. or higher.

<4> The polymer film according to any one of <1> to <3>,
in which the polymer having a dielectric loss tangent of 0.005 or less is at least one polymer selected from the group consisting of a liquid crystal polymer, a fluorine-based polymer, a polymerized substance of a compound which has a cyclic aliphatic hydrocarbon group and a group having an ethylenically unsaturated bond, a polyphenylene ether, and an aromatic polyether ketone.

<5> The polymer film according to any one of <1> to <4>,
in which the functional group is a covalent-bondable group.

<6> The polymer film according to <5>,
in which the covalent-bondable group is at least one functional group selected from the group consisting of an epoxy group, an oxetanyl group, an isocyanate group, an acid anhydride group, a carbodiimide group, an N-hydroxy ester group, a glyoxal group, an imide ester group, a halogenated alkyl group, and a thiol group.

<7> The polymer film according to any one of <1> to <4>,
in which the functional group is an ion-bondable group, a hydrogen-bondable group, or a dipole-interactable group.

<8> The polymer film according to any one of <1> to <7>,
in which the polymer film contains a cured substance of a polyfunctional reactive compound.

<9> The polymer film according to any one of <1> to <8>,
in which the layer B contains a polymer having a functional group as the compound having a functional group.

<10> The polymer film according to <9>,
in which the polymer having a functional group is a precursor of a liquid crystal polymer.

<11> The polymer film according to any one of <1> to <10>,
in which the polymer having a dielectric loss tangent of 0.005 or less and the compound having a functional group are compatible with each other.

<12> The polymer film according to any one of <1> to <11>,
in which a difference between an SP value of the polymer having a dielectric loss tangent of 0.005 or less, which is determined by Hoy method, and an SP value of the compound having a functional group, which is determined by Hoy method, is 5 MPa$^{0.5}$ or less.

<13> The polymer film according to any one of <1> to <12>, in which the polymer having a dielectric loss tangent of 0.005 or less is a liquid crystal polymer having a constitutional unit represented by any of Formulae (1) to (3), $$—O\text{-}Ar^1\text{-}CO— \quad \text{Formula (1)}$$

$$—CO\text{-}Ar^2\text{-}CO— \quad \text{Formula (2)}$$

$$—X\text{-}Ar^3\text{-}Y— \quad \text{Formula (3)}$$

in Formulae (1) to (3), $Ar^1$ represents a phenylene group, a naphthylene group, or a biphenylylene group, $Ar^2$ and $Ar^3$ each independently represent a phenylene group, a naphthylene group, a biphenylylene group, or a group represented by Formula (4), X and Y each independently represent an oxygen atom or an imino group, and hydrogen atoms in $Ar^1$ to $Ar^3$ may be each independently substituted with a halogen atom, an alkyl group, or an aryl group, $$\text{-}Ar^4\text{-}Z\text{-}Ar^5\text{-} \quad \text{Formula (4)}$$

in Formula (4), $Ar^4$ and $Ar^5$ each independently represent a phenylene group or a naphthylene group, and Z represents an oxygen atom, a sulfur atom, a carbonyl group, a sulfonyl group, or an alkylene group.

<14> The polymer film according to any one of <1> to <13>, further comprising:

a layer C, in which the layer B, the layer A, and the layer C are provided in this order.

<15> The polymer film according to any one of <1> to <14>, in which a dielectric loss tangent of the polymer film is 0.01 or less.

<16> The polymer film according to any one of <1> to <15>, in which a dielectric loss tangent of the layer B is 0.02 or less.

<17> The polymer film according to <14>, in which a dielectric loss tangent of the layer C is 0.02 or less.

<18> A polymer film comprising:

a layer A; and a layer B on at least one surface of the layer A, in which the layer B contains a liquid crystal polymer and a compound having a functional group, and the functional group is at least one group selected from the group consisting of a covalent-bondable group, an ion-bondable group, a hydrogen-bondable group, a dipole-interactable group, and a curing reactive group.

<19> A polymer film comprising:

a layer A; and a layer B on at least one surface of the layer A, in which the layer B contains a polymer having a dielectric loss tangent of 0.01 or less and a compound having a functional group, and the functional group is at least one group selected from the group consisting of a covalent-bondable group, an ion-bondable group, a hydrogen-bondable group, a dipole-interactable group, and a curing reactive group.

<20> The polymer film according to any one of <1> to <19>, in which the compound having a functional group is a compound which interacts with, is bonded to, or forms an entanglement with the polymer having a dielectric loss tangent of 0.005 or less, the liquid crystal polymer, or the polymer having a dielectric loss tangent of 0.01 or less.

<21> A laminate comprising:

the polymer film according to any one of <1> to <20>; and a metal layer disposed on at least one surface of the polymer film.

<22> The laminate according to <21>, in which the laminate includes metal layers respectively disposed on both surfaces of the polymer film.

<23> The laminate according to <21> or <22>, in which a surface roughness Rz of the metal layer on a side in contact with the polymer film is 5 μm or less.

<24> The laminate according to any one of <21> to <23>, in which the metal layer is a copper layer, and a peel strength between the polymer film and the copper layer is 0.5 kN/m or more.

<25> The laminate according to any one of <21> to <24>, in which the copper layer has an interactable group with the polymer film on a surface of a side in contact with the polymer film.

<26> The laminate according to <25>, in which the interactable group is an amino group.

According to the aspect of the present invention, it is possible to provide a polymer film having excellent adhesiveness with a substrate.

Further, according to another aspect of the present invention, it is possible to provide a laminate using the above-described polymer film.

DESCRIPTION OF THE PREFERRED EMBODIMENTS

Hereinafter, the contents of the present disclosure will be described in detail. The description of configuration requirements below is made based on representative embodiments of the present disclosure in some cases, but the present disclosure is not limited to such embodiments.

Further, in the present specification, a numerical range shown using "to" indicates a range including numerical values described before and after "to" as a lower limit and an upper limit.

In a numerical range described in a stepwise manner in the present disclosure, an upper limit or a lower limit described in one numerical range may be replaced with an upper limit or a lower limit in another numerical range described in a stepwise manner. Further, in a numerical range described in the present disclosure, an upper limit or a lower limit described in the numerical range may be replaced with a value described in an example.

Further, in a case where substitution or unsubstitution is not noted in regard to the notation of a "group" (atomic group) in the present specification, the "group" includes not only a group that does not have a substituent but also a group having a substituent. For example, the concept of an "alkyl group" includes not only an alkyl group that does not have a substituent (unsubstituted alkyl group) but also an alkyl group having a substituent (substituted alkyl group).

In the present specification, the concept of "(meth)acryl" includes both acryl and methacryl, and the concept of "(meth)acryloyl" includes both acryloyl and methacryloyl.

Further, the term "step" in the present specification indicates not only an independent step but also a step which cannot be clearly distinguished from other steps as long as the intended purpose of the step is achieved.

Further, in the present disclosure, "% by mass" has the same definition as that for "% by weight", and "part by mass" has the same definition as that for "part by weight".

Furthermore, in the present disclosure, a combination of two or more preferred embodiments is a more preferred embodiment.

Further, the weight-average molecular weight (Mw) and the number-average molecular weight (Mn) in the present disclosure are molecular weights converted using polystyrene as a standard substance by performing detection with a gel permeation chromatography (GPC) analysis apparatus using TSKgel SuperHM-H (trade name, manufactured by Tosoh Corporation) column, a solvent of pentafluorophenol (PFP) and chloroform at a mass ratio of 1:2, and a differential refractometer, unless otherwise specified.

Hereinafter, the present disclosure will be described in detail.

(Polymer Film)

A first embodiment of the polymer film according to the present disclosure includes a layer A and a layer B on at least one surface of the layer A, in which the layer B contains a polymer having a dielectric loss tangent of 0.005 or less and a compound having a functional group, and the functional group is at least one group selected from the group consisting of a covalent-bondable group, an ion-bondable group, a hydrogen-bondable group, a dipole-interactable group, and a curing reactive group.

A second embodiment of the polymer film according to the present disclosure includes a layer A and a layer B on at least one surface of the layer A, in which the layer B contains a polymer having a dielectric loss tangent of 0.01 or less and a compound having a functional group, and the functional group is at least one group selected from the group consisting of a covalent-bondable group, an ion-bondable group, a hydrogen-bondable group, a dipole-interactable group, and a curing reactive group.

A third embodiment of the polymer film according to the present disclosure includes a layer A and a layer B on at least one surface of the layer A, in which the layer B contains a liquid crystal polymer and a compound having a functional group, and the functional group is at least one group selected from the group consisting of a covalent-bondable group, an ion-bondable group, a hydrogen-bondable group, a dipole-interactable group, and a curing reactive group.

In the present specification, the expression "polymer film according to the embodiment of the present disclosure" denotes all the first embodiment, the second embodiment, and the third embodiment described above, unless otherwise specified.

With regard to the polymer film in the related art having a low dielectric loss tangent, such as the polymer film disclosed in JP2020-26474A, the present inventor has found that adhesiveness with a substrate (for example, a plastic film, a metal foil, or a metal wire) is insufficient, and with regard to the resin layer having excellent adhesiveness with a metal layer, such as the resin layer disclosed in WO2019/054334A, the present inventor has found that a dielectric loss tangent is insufficient.

As a result of intensive research conducted by the present inventor, it has been found that, with the above-described configuration, it is possible to provide a polymer film having excellent adhesiveness with the substrate.

Detailed mechanism by which the adhesiveness can be ensured is not clear, but it is presumed as follows.

Since the above-described polymer film contains a polymer having a dielectric loss tangent of 0.01 or less or 0.005 or less or a liquid crystal polymer, and a compound having a functional group, and the functional group is at least one group selected from the group consisting of a covalent-bondable group, an ion-bondable group, a hydrogen-bondable group, and a dipole-interactable group, even in a case of using a polymer having a dielectric loss tangent of 0.01 or less or 0.005 or less or a liquid crystal polymer, it is presumed that the above-described specific functional group interacts with the substrate or with a group present in a surface of the substrate (for example, with a metal or with a surface of the metal), so that the adhesiveness with the metal layer is excellent.

<Layer B>

The polymer film according to the embodiment of the present disclosure includes a layer A and a layer B on at least one surface of the layer A, in which the layer B contains a polymer having a dielectric loss tangent of 0.01 or less or 0.005 or less or a liquid crystal polymer, and a compound having a functional group.

Further, examples of a method for detecting or determining a layer configuration of the polymer film, a thickness of each layer, and the like include the following methods.

First, a cross-sectional sample of the polymer film is cut out by a microtome, and a layer configuration and a thickness of each layer are determined with an optical microscope. In a case where the determination with an optical microscope is difficult, the determination may be obtained by performing morphological observation with a scanning electron microscope (SEM), component analysis with a time-of-flight secondary ion mass spectrometry (TOF-SIMS), or the like.

[Polymer Having Dielectric Loss Tangent of 0.01 or Less]

In the first embodiment of the polymer film according to the present disclosure, the layer B contains a polymer having a dielectric loss tangent of 0.005 or less.

In the second embodiment of the polymer film according to the present disclosure, the layer B contains a polymer having a dielectric loss tangent of 0.01 or less.

A dielectric loss tangent of the polymer contained in the layer B of the polymer film according to the embodiment of the present disclosure is, for example, 0.01 or less, preferably 0.008 or less, more preferably 0.0075 or less, still more preferably 0.006 or less, and particularly preferably 0.005 or less.

From the viewpoint of dielectric loss tangent of the polymer film and adhesiveness with the metal layer, the dielectric loss tangent of the polymer having a dielectric loss tangent of 0.005 or less is preferably 0.004 or less, more preferably 0.0035 or less, and particularly preferably 0.003 or less. The lower limit values of both cases are not particularly set, and examples thereof include a value of more than 0.

The dielectric loss tangent in the present disclosure is measured by the following method.

A dielectric constant is measured by a resonance perturbation method at a frequency of 10 GHz. A 10 GHz cavity resonator (CP531 manufactured by Kanto Electronics Application & Development Inc.) is connected to a network analyzer ("E8363B" manufactured by Agilent Technology), and a sample (width: 2 mm x length: 80 mm) of the polymer film or each layer is inserted into the cavity resonator, and the dielectric constant and dielectric loss tangent of the polymer film or each layer are measured based on a change in resonance frequency for 96 hours before and after the insertion in an environment of a temperature of 25° C. and a humidity of 60% RH.

In a case where each layer is measured, an unnecessary layer may be scraped off with a razor or the like to prepare an evaluation sample of only the target layer. In addition, in a case where it is difficult to take out the single film because the thickness of the layer is thin, a layer to be measured may be scraped off with a razor or the like, and the obtained powdery sample may be used. In the present disclosure, the measurement of the dielectric loss tangent of the polymer is carried out according to the above-described method of measuring a dielectric loss tangent by identifying or isolating a chemical structure of the polymer constituting each layer and using a powdered sample of the polymer to be measured.

From the viewpoint of dielectric loss tangent of the polymer film, adhesiveness with the metal layer, and heat resistance, a melting point Tm or a 5%-by-mass-loss temperature Td of the polymer having a dielectric loss tangent of 0.01 or less or 0.005 or less is preferably 200° C. or higher, more preferably 250° C. or higher, still more preferably 280° C. or higher, and particularly preferably 300° C. or higher. The upper limit value thereof is not particularly limited, but is preferably 500° C. or lower and more preferably 420° C. or lower.

The melting point Tm in the present disclosure is defined as a value measured by a differential scanning calorimetry (DSC) device. 5 mg of a sample is put into a measurement pan of the DSC, and a peak temperature of an endothermic peak which appears in a case where the sample is heated from 30° C. at 10° C./min in a nitrogen stream is defined as the Tm of the film.

In addition, the 5%-by-mass-loss temperature Td in the present disclosure is measured with a thermogravimetric analysis (TGA) device. That is, a weight of the sample put into the measurement pan is defined as an initial value, and a temperature at which the weight is reduced by 5% by mass with respect to the initial value due to the heating is defined as the 5%-by-mass-loss temperature Td.

From the viewpoint of dielectric loss tangent of the polymer film, adhesiveness with metal, and heat resistance, a glass transition temperature Tg of the polymer having a dielectric loss tangent of 0.01 or less or 0.005 or less is preferably 150° C. or higher, and more preferably 200° C. or higher. The upper limit value thereof is not particularly limited, but is preferably lower than 350° C., and more preferably lower than 280° C. or 280° C. or lower.

The glass transition temperature Tg in the present disclosure is defined as a value measured by a differential scanning calorimetry (DSC) device.

A weight-average molecular weight Mw of the polymer having a dielectric loss tangent of 0.01 or less or 0.005 or less is preferably 1,000 or more, more preferably 2,000 or more, and particularly preferably 5,000 or more. In addition, the weight-average molecular weight Mw of the polymer having a dielectric loss tangent of 0.01 or less or 0.005 or less is preferably 50,000 or less, more preferably 20,000 or less, and particularly preferably less than 13,000.

In the present disclosure, the type of the polymer having a dielectric loss tangent of 0.01 or less or 0.005 or less is not particularly limited, and a known polymer can be used.

Examples of the polymer having a dielectric loss tangent of 0.01 or less or the polymer having a dielectric loss tangent of 0.005 or less include thermoplastic resins such as a liquid crystal polymer, a fluorine-based polymer, a polymerized substance of a compound which has a cyclic aliphatic hydrocarbon group and a group having an ethylenically unsaturated bond, polyether ether ketone, polyolefin, polyamide, polyester, polyphenylene sulfide, aromatic polyether ketone, polycarbonate, polyethersulfone, polyphenylene ether and a modified product thereof, and polyetherimide; elastomers such as a copolymer of glycidyl methacrylate and polyethylene; and thermosetting resins such as a phenol resin, an epoxy resin, a polyimide resin, and a cyanate resin.

Among these, from the viewpoint of dielectric loss tangent of the polymer film, adhesiveness with metal, and heat resistance, at least one polymer selected from the group consisting of a liquid crystal polymer, a fluorine-based polymer, a polymerized substance of a compound which has a cyclic aliphatic hydrocarbon group and a group having an ethylenically unsaturated bond, polyphenylene ether, and aromatic polyether ketone is preferable, and at least one polymer selected from the group consisting of a liquid crystal polymer and a fluorine-based polymer is more preferable.

From the viewpoint of adhesiveness and mechanical strength of the polymer film, a liquid crystal polymer is preferable, and from the viewpoint of heat resistance and dielectric loss tangent, a fluorine-based polymer is preferable.

—Liquid Crystal Polymer—

In the third embodiment of the polymer film according to the present disclosure, the layer B contains a liquid crystal polymer.

In the first embodiment of the polymer film according to the present disclosure, from the viewpoint of dielectric loss tangent of the polymer film, it is preferable that the polymer having a dielectric loss tangent of 0.005 or less is a liquid crystal polymer.

In addition, in the second embodiment of the polymer film according to the present disclosure, from the viewpoint of dielectric loss tangent of the polymer film, it is preferable that the polymer having a dielectric loss tangent of 0.01 or less is a liquid crystal polymer.

In the present disclosure, the type of the liquid crystal polymer is not particularly limited, and a known liquid crystal polymer can be used.

In addition, the liquid crystal polymer may be a thermotropic liquid crystal polymer which exhibits liquid crystallinity in a molten state, or may be a lyotropic liquid crystal polymer which exhibits liquid crystallinity in a solution state. Further, in a case where the liquid crystal polymer is a thermotropic liquid crystal polymer, the liquid crystal polymer is preferably a liquid crystal polymer which is molten at a temperature of 450° C. or lower.

Examples of the liquid crystal polymer include a liquid crystal polyester, a liquid crystal polyester amide in which an amide bond is introduced into the liquid crystal polyester, a liquid crystal polyester ether in which an ether bond is introduced into the liquid crystal polyester, and a liquid crystal polyester carbonate in which a carbonate bond is introduced into the liquid crystal polyester.

In addition, as the liquid crystal polymer, from the viewpoint of liquid crystallinity and thermal expansion coefficient, a polymer having an aromatic ring is preferable, and an aromatic polyester or an aromatic polyester amide is more preferable.

Further, the liquid crystal polymer may be a polymer in which an imide bond, a carbodiimide bond, a bond derived from an isocyanate, such as an isocyanurate bond, or the like is further introduced into the aromatic polyester or the aromatic polyester amide.

Further, it is preferable that the liquid crystal polymer is a wholly aromatic liquid crystal polymer formed of only an aromatic compound as a raw material monomer.

Examples of the liquid crystal polymer include the following liquid crystal polymers.

1) a liquid crystal polymer obtained by polycondensing (i) an aromatic hydroxycarboxylic acid, (ii) an aromatic dicarboxylic acid, and (iii) at least one compound selected from the group consisting of an aromatic diol, an aromatic hydroxyamine, and an aromatic diamine;
2) a liquid crystal polymer obtained by polycondensing a plurality of types of aromatic hydroxycarboxylic acids;
3) a liquid crystal polymer obtained by polycondensing (i) an aromatic dicarboxylic acid and (ii) at least one compound selected from the group consisting of an aromatic diol, an aromatic hydroxyamine, and an aromatic diamine;
4) a liquid crystal polymer obtained by polycondensing (i) polyester such as polyethylene terephthalate and (ii) an aromatic hydroxycarboxylic acid.

Here, the aromatic hydroxycarboxylic acid, the aromatic dicarboxylic acid, the aromatic diol, the aromatic hydroxyamine, and the aromatic diamine may be each independently replaced with a polycondensable derivative.

For example, the aromatic hydroxycarboxylic acid and the aromatic dicarboxylic acid can be replaced with aromatic hydroxycarboxylic acid ester and aromatic dicarboxylic acid ester, by converting a carboxy group into an alkoxycarbonyl group or an aryloxycarbonyl group.

The aromatic hydroxycarboxylic acid and the aromatic dicarboxylic acid can be replaced with aromatic hydroxycarboxylic acid halide and aromatic dicarboxylic acid halide, by converting a carboxy group into a haloformyl group.

The aromatic hydroxycarboxylic acid and the aromatic dicarboxylic acid can be replaced with aromatic hydroxycarboxylic acid anhydride and aromatic dicarboxylic acid anhydride, by converting a carboxy group into an acyloxycarbonyl group.

Examples of a polymerizable derivative of a compound having a hydroxy group, such as an aromatic hydroxycarboxylic acid, an aromatic diol, and an aromatic hydroxyamine, include a derivative (acylated product) obtained by acylating a hydroxy group and converting the acylated group into an acyloxy group.

For example, the aromatic hydroxycarboxylic acid, the aromatic diol, and the aromatic hydroxyamine can be each replaced with an acylated product by acylating a hydroxy group and converting the acylated group into an acyloxy group.

Examples of a polymerizable derivative of a compound having an amino group, such as an aromatic hydroxyamine or an aromatic diamine, include a derivative (acylated product) obtained by acylating an amino group and converting the acylated group to an acylamino group.

For example, the aromatic hydroxyamine and the aromatic diamine can be each replaced with an acylated product by acylating an amino group and converting the acylated group into an acylamino group.

From the viewpoint of liquid crystallinity, dielectric loss tangent of the polymer film, and adhesiveness with the metal layer, the liquid crystal polymer preferably has a constitutional unit represented by any of Formulae (1) to (3) (hereinafter, a constitutional unit represented by Formula (1) or the like may be referred to as a constitutional unit (1) or the like), more preferably has a constitutional unit represented by Formula (1), and particularly preferably has a constitutional unit represented by Formula (1), a constitutional unit represented by Formula (2), and a constitutional unit represented by Formula (3).

$$—O-Ar^1-CO— \qquad \text{Formula (1)}$$

$$—CO-Ar^2-CO— \qquad \text{Formula (2)}$$

$$—X-Ar^3-Y— \qquad \text{Formula (3)}$$

In Formulae (1) to (3), $Ar^1$ represents a phenylene group, a naphthylene group, or a biphenylylene group, $Ar^2$ and $Ar^3$ each independently represent a phenylene group, a naphthylene group, a biphenylylene group, or a group represented by Formula (4), X and Y each independently represent an oxygen atom or an imino group, and hydrogen atoms in $Ar^1$ to $Ar^3$ may be each independently substituted with a halogen atom, an alkyl group, or an aryl group.

$$-Ar^4-Z-Ar^5- \qquad \text{Formula (4)}$$

In Formula (4), $Ar^4$ and $Ar^5$ each independently represent a phenylene group or a naphthylene group, and Z represents an oxygen atom, a sulfur atom, a carbonyl group, a sulfonyl group, or an alkylene group.

Examples of the halogen atom include a fluorine atom, a chlorine atom, a bromine atom, and an iodine atom.

Examples of the alkyl group include a methyl group, an ethyl group, an n-propyl group, an isopropyl group, an n-butyl group, an isobutyl group, an s-butyl group, a t-butyl group, an n-hexyl group, a 2-ethylhexyl group, an n-octyl group, and an n-decyl group. The number of carbon atoms in the alkyl group is preferably 1 to 10.

Examples of the aryl group include a phenyl group, an o-tolyl group, an m-tolyl group, a p-tolyl group, a 1-naphthyl group, and a 2-naphthyl group. The number of carbon atoms in the aryl group is preferably 6 to 20.

In a case where the hydrogen atom is substituted with any of these groups, the number of each of substitutions in $Ar^1$, $Ar^2$, and $Ar^3$ independently is preferably 2 or less and more preferably 1.

Examples of the alkylene group include a methylene group, a 1,1-ethanediyl group, a 1-methyl-1,1-ethanediyl group, a 1,1-butanediyl group, and a 2-ethyl-1,1-hexanediyl group. The number of carbon atoms in the alkylene group is preferably 1 to 10.

The constitutional unit (1) is a constitutional unit derived from an aromatic hydroxycarboxylic acid.

Preferred examples of the constitutional unit (1) include an aspect in which $Ar^1$ represents a p-phenylene group (constitutional unit derived from p-hydroxybenzoic acid), an aspect in which $Ar^1$ represents a 2,6-naphthylene group (constitutional unit derived from 6-hydroxy-2-naphthoic acid), and an aspect in which $Ar^1$ represents a 4,4'-biphenylylene group (constitutional unit derived from 4'-hydroxy-4-biphenylcarboxylic acid).

The constitutional unit (2) is a constitutional unit derived from an aromatic dicarboxylic acid.

Preferred examples of the constitutional unit (2) include an aspect in which $Ar^2$ represents a p-phenylene group (constitutional unit derived from terephthalic acid), an aspect in which $Ar^2$ represents an m-phenylene group (constitutional unit derived from isophthalic acid), an aspect in which $Ar^2$ represents a 2,6-naphthylene group (constitutional unit derived from 2,6-naphthalenedicarboxylic acid), and an aspect in which $Ar^2$ represents a diphenylether-4,4'-diyl group (constitutional unit derived from diphenylether-4,4'-dicarboxylic acid).

The constitutional unit (3) is a constitutional unit derived from an aromatic diol, an aromatic hydroxylamine, or an aromatic diamine.

Preferred examples of the constitutional unit (3) include an aspect in which $Ar^3$ represents a p-phenylene group (constitutional unit derived from hydroquinone, p-aminophenol, or p-phenylenediamine), an aspect in which $Ar^3$ represents an m-phenylene group (constitutional unit derived from isophthalic acid), and an aspect in which $Ar^3$ represents a 4,4'-biphenylylene group (constitutional unit derived from 4,4'-dihydroxybiphenyl, 4-amino-4'-hydroxybiphenyl, or 4,4'-diaminobiphenyl).

A content of the constitutional unit (1) is preferably 30% by mole or more, more preferably 30% to 80% by mole, still more preferably 30% to 60% by mole, and particularly preferably 30% to 40% by mole with respect to the total amount of all constitutional units (a value obtained by dividing the mass of each constitutional unit (also referred to as "monomer unit") constituting the liquid crystal polymer by the formula weight of each constitutional unit to calculate an amount (mole) equivalent to the substance amount of each constitutional unit and adding up the amounts).

The content of the constitutional unit (2) is preferably 35% by mole or less, more preferably 10% by mole to 35% by mole, still more preferably 20% by mole to 35% by mole, and particularly preferably 30% by mole to 35% by mole with respect to the total amount of all constitutional units.

The content of the constitutional unit (3) is preferably 35% by mole or less, more preferably 10% by mole to 35% by mole, still more preferably 20% by mole to 35% by mole, and particularly preferably 30% by mole to 35% by mole with respect to the total amount of all constitutional units.

The heat resistance, the strength, and the rigidity are likely to be improved as the content of the constitutional unit (1) increases, but the solubility in a solvent is likely to be decreased in a case where the content thereof is extremely large.

A proportion of the content of the constitutional unit (2) to the content of the constitutional unit (3) is expressed as [content of constitutional unit (2)]/[content of constitutional unit (3)] (mol/mol), and is preferably 0.9/1 to 1/0.9, more preferably 0.95/1 to 1/0.95, and still more preferably 0.98/1 to 1/0.98.

The liquid crystal polymer may have two or more kinds of each of the constitutional units (1) to (3) independently. In addition, the liquid crystal polymer may have a constitutional unit other than the constitutional units (1) to (3), but the content thereof is preferably 10% by mole or less and more preferably 5% by mole or less with respect to the total amount of all the constitutional units.

From the viewpoint of solubility in a solvent, the liquid crystal polymer preferably has, as the constitutional unit (3), a constitutional unit (3) in which at least one of X or Y is an imino group, that is, preferably has as the constitutional unit (3), at least one of a constitutional unit derived from an aromatic hydroxylamine or a constitutional unit derived from an aromatic diamine, and it is more preferable to have only a constitutional unit (3) in which at least one of X or Y is an imino group.

It is preferable that the liquid crystal polymer is produced by melt-polymerizing raw material monomers corresponding to the constitutional units constituting the liquid crystal polymer. The melt polymerization may be carried out in the presence of a catalyst. Examples of the catalyst include metal compounds such as magnesium acetate, stannous acetate, tetrabutyl titanate, lead acetate, sodium acetate, potassium acetate, and antimony trioxide, and nitrogen-containing heterocyclic compounds such as 4-(dimethylamino)pyridine and 1-methylimidazole; and preferred examples thereof include nitrogen-containing heterocyclic compounds. The melt polymerization may be further carried out by solid phase polymerization as necessary.

The lower limit value of a flow start temperature of the liquid crystal polymer is preferably 180° C., more preferably 200° C., and still more preferably 250° C., and the upper limit value of the flow start temperature thereof is preferably 350° C., more preferably 330° C., and still more preferably 310° C. In a case where the flow start temperature of the liquid crystal polymer is within the above-described range, the solubility, the heat resistance, the strength, and the rigidity are excellent, and the viscosity of the solution is appropriate.

The flow start temperature, also referred to as a flow temperature, is a temperature at which a viscosity of 4,800 Pa s (48,000 poises) is exhibited in a case where the liquid crystal polymer is melted and extruded from a nozzle having an inner diameter of 1 mm and a length of 10 mm while the temperature is raised at a rate of 4° C./min under a load of 9.8 MPa (100 kg/cm$^2$) using a capillary rheometer and is a guideline for the molecular weight of the liquid crystal polymer (see p. 95 of "Liquid Crystal Polymers—Synthesis/Molding/Applications—", written by Naoyuki Koide, CMC Corporation, Jun. 5, 1987).

In addition, a weight-average molecular weight of the liquid crystal polymer is preferably 1,000,000 or less, more preferably 3,000 to 300,000, still more preferably 5,000 to 100,000, and particularly preferably 5,000 to 30,000. In a case where the weight-average molecular weight of the liquid crystal polymer is within the above-described range, a film after heat treatment is excellent in thermal conductivity, heat resistance, strength, and rigidity in the thickness direction.

—Fluorine-Based Polymer—

From the viewpoint of heat resistance and mechanical strength, the polymer having a dielectric loss tangent of 0.005 or less is preferably a fluorine-based polymer.

In the present disclosure, the type of the fluorine-based polymer used as the polymer having a dielectric loss tangent of 0.005 or less is not particularly limited as long as the dielectric loss tangent thereof is 0.005 or less, and a known fluorine-based polymer can be used.

Examples of the fluorine-based polymer include polytetrafluoroethylene, polychlorotrifluoroethylene, polyvinylidene fluoride, polyvinyl fluoride, a perfluoroalkoxy fluororesin, an ethylene tetrafluoride/propylene hexafluoride copolymer, an ethylene/ethylene tetrafluoride copolymer, and an ethylene/chlorotrifluoroethylene copolymer.

Among these, polytetrafluoroethylene is preferable.

In addition, examples of the fluorine-based polymer include a fluorinated α-olefin monomer, that is, an α-olefin monomer containing at least one fluorine atom; and a homopolymer and a copolymer optionally containing a constitutional unit derived from a non-fluorinated ethylenically unsaturated monomer reactive to the fluorinated α-olefin monomer.

Examples of the fluorinated α-olefin monomer include $CF_2$=$CF_2$, $CHF$=$CF_2$, $CH_2$=$CF_2$, $CHCl$=$CHF$, $CClF$=$CF_2$, $CCl_2$=$CF_2$, $CClF$=$CClF$, $CHF$=$CCl_2$, $CH_2$=$CClF$, $CCl_2$=$CClF$, $CF_3CF$=$CF_2$, $CF_3CF$=$CHF$, $CF_3CH$=$CF_2$, $CF_3CH$=$CH_2$, $CHF_2CH$=$CHF$, $CF_3CF$=$CF_2$, and perfluoro(alkyl having 2 to 8 carbon atoms) vinyl ether (for example, perfluoromethyl vinyl ether, perfluoropropyl vinyl ether, and perfluorooctyl vinyl ether). Among these, at least one monomer selected from the group consisting of tetrafluoroethylene (CF$_2$=CF$_2$), chlorotrifluoroethylene (CClF=CF$_2$), (perfluorobutyl)ethylene, vinylidene fluoride (CH$_2$=CF$_2$), and hexafluoropropylene (CF$_2$=CFCF$_3$) is preferable.

Examples of the non-fluorinated monoethylenically unsaturated monomer include ethylene, propylene, butene, and an ethylenically unsaturated aromatic monomer (for example, styrene and α-methylstyrene).

The fluorinated α-olefin monomer may be used alone or in combination of two or more thereof.

In addition, the non-fluorinated ethylenically unsaturated monomer may be used alone or in combination of two or more thereof.

Examples of the fluorine-based polymer include polychlorotrifluoroethylene (PCTFE), poly(chlorotrifluoroethylene-propylene), poly(ethylene-tetrafluoroethylene) (ETFE), poly(ethylene-chlorotrifluoroethylene) (ECTFE), poly(hexafluoropropylene), poly(tetrafluoroethylene) (PTFE), poly(tetrafluoroethylene-ethylene-propylene), poly(tetrafluoroethylene-hexafluoropropylene) (FEP), poly(tetrafluoroethylene-propylene) (FEPM), poly(tetrafluoroethylene-perfluoropropylene vinyl ether), poly(tetrafluoroethylene-perfluoroalkyl vinyl ether) (PFA) (for example, poly(tetrafluoroethylene-perfluoropropyl vinyl ether)), polyvinyl fluoride (PVF), polyvinylidene fluoride (PVDF), poly(vinylidene fluoride-chlorotrifluoroethylene), perfluoropolyether, perfluorosulfonic acid, and perfluoropolyoxetane.

The fluorine-based polymer may be used alone or in combination of two or more thereof.

The fluorine-based polymer is preferably at least one of FEP, PFA, ETFE, or PTFE. The FEP is available from Du Pont as the trade name of TEFLON (registered trademark) FEP or from DAIKIN INDUSTRIES, LTD. as the trade name of NEOFLON FEP; and the PFA is available from DAIKIN INDUSTRIES, LTD. as the trade name of NEOFLON PFA, from Du Pont as the trade name of TEFLON (registered trademark) PFA, or from Solvay Solexis as the trade name of HYFLON PFA.

The fluorine-based polymer preferably includes PTFE. The PTFE can be included as a PTFE homopolymer, a partially modified PTFE homopolymer, or a combination including one or both of these. The partially modified PTFE homopolymer preferably contains a constitutional unit derived from a comonomer other than tetrafluoroethylene in an amount of less than 1% by mass based on the total mass of the polymer.

The fluorine-based polymer may be a crosslinkable fluoropolymer having a crosslinkable group. The crosslinkable fluoropolymer can be crosslinked by a known crosslinking method in the related art. One of the representative crosslinkable fluoropolymers is a fluoropolymer having a (meth)acryloxy group. For example, the crosslinkable fluoropolymer can be represented by Formula:

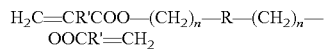

in the formula, R is a fluorine-based oligomer chain having two or more constitutional units derived from the fluorinated α-olefin monomer or the non-fluorinated monoethylenically unsaturated monomer, R' is H or —CH$_3$, and n is 1 to 4. R may be a fluorine-based oligomer chain having a constitutional unit derived from tetrafluoroethylene.

In order to initiate a radical crosslinking reaction through the (meth)acryloxy group in the fluorine-based polymer, by exposing the fluoropolymer having a (meth)acryloxy group to a free radical source, a crosslinked fluoropolymer network can be formed. The free radical source is not particularly limited, and suitable examples thereof include a photoradical polymerization initiator and an organic peroxide. Appropriate photoradical polymerization initiators and organic peroxides are well known in the art. The crosslinkable fluoropolymer is commercially available, and examples thereof include Viton B manufactured by Du Pont.

—Polymerized Substance of Compound which has Cyclic Aliphatic Hydrocarbon Group and Group Having Ethylenically Unsaturated Bond—

The polymer having a dielectric loss tangent of 0.005 or less may be a polymerized substance of a compound which has a cyclic aliphatic hydrocarbon group and a group having an ethylenically unsaturated bond.

Examples of the polymerized substance of a compound which has a cyclic aliphatic hydrocarbon group and a group having an ethylenically unsaturated bond include thermoplastic resins having a constitutional unit formed from a monomer having a cyclic olefin such as norbornene and a polycyclic norbornene-based monomer, which is also referred to as a thermoplastic cyclic olefin-based resin.

The polymerized substance of a compound which has a cyclic aliphatic hydrocarbon group and a group having an ethylenically unsaturated bond may be a ring-opened polymer of the above-described cyclic olefin, a hydrogenated product of a ring-opened copolymer using two or more cyclic olefins, or an addition polymer of a cyclic olefin and a linear olefin or aromatic compound having an ethylenically unsaturated bond such as a vinyl group. In addition, a polar group may be introduced into the polymerized substance of a compound which has a cyclic aliphatic hydrocarbon group and a group having an ethylenically unsaturated bond.

The polymerized substance of a compound which has a cyclic aliphatic hydrocarbon group and a group having an ethylenically unsaturated bond may be used alone or in combination of two or more thereof.

A ring structure of the cyclic aliphatic hydrocarbon group may be a single ring, a fused ring in which two or more rings are fused, or a crosslinked ring.

Examples of the ring structure of the cyclic aliphatic hydrocarbon group include a cyclopentane ring, a cyclohexane ring, a cyclooctane ring, an isophorone ring, a norbornane ring, and a dicyclopentane ring.

The compound which has a cyclic aliphatic hydrocarbon group and a group having an ethylenically unsaturated bond may be a monofunctional ethylenically unsaturated compound or a polyfunctional ethylenically unsaturated compound.

The number of cyclic aliphatic hydrocarbon groups in the compound which has a cyclic aliphatic hydrocarbon group and a group having an ethylenically unsaturated bond may be 1 or more, and may be 2 or more.

It is sufficient that the polymerized substance of a compound which has a cyclic aliphatic hydrocarbon group and a group having an ethylenically unsaturated bond is a polymer obtained by polymerizing at least one compound which has a cyclic aliphatic hydrocarbon group and a group having an ethylenically unsaturated bond, and it may be a polymerized substance of two or more kinds of the compound which has a cyclic aliphatic hydrocarbon group and a group having an ethylenically unsaturated bond or a copolymer with other ethylenically unsaturated compounds having no cyclic aliphatic hydrocarbon group.

In addition, the polymerized substance of a compound which has a cyclic aliphatic hydrocarbon group and a group having an ethylenically unsaturated bond is preferably a cycloolefin polymer.

—Polyphenylene Ether—

The layer A preferably contains a polyphenylene ether.

In a case where heat curing is performed after film formation, from the viewpoint of heat resistance and film-forming property, a weight-average molecular weight (Mw) of the polyphenylene ether is preferably 500 to 5,000 and preferably 500 to 3,000. In addition, in a case where the heat curing is not performed, the weight-average molecular weight (Mw) of the polyphenylene ether is not particularly limited, but is preferably 3,000 to 100,000 and preferably 5,000 to 50,000.

In the polyphenylene ether, from the viewpoint of dielectric loss tangent and heat resistance, the average number of molecular terminal phenolic hydroxyl groups per molecule (the number of terminal hydroxyl groups) is preferably 1 to 5 and more preferably 1.5 to 3.

The number of hydroxyl groups or the number of phenolic hydroxyl groups in the polyphenylene ether can be found, for example, from a standard value of a product of the polyphenylene ether. In addition, examples of the number of terminal hydroxyl groups or the number of terminal phenolic hydroxyl groups include a numerical value representing an average value of hydroxyl groups or phenolic hydroxyl groups per molecule of all polyphenylene ethers present in 1 mol of the polyphenylene ether.

The polyphenylene ether may be used alone or in combination of two or more thereof.

Examples of the polyphenylene ether include a polyphenylene ether including 2,6-dimethylphenol and at least one of bifunctional phenol or trifunctional phenol, and a compound mainly including the polyphenylene ether, such as poly(2,6-dimethyl-1,4-phenylene oxide). More specifically, for example, a compound having a structure represented by Formula (PPE) is preferable.

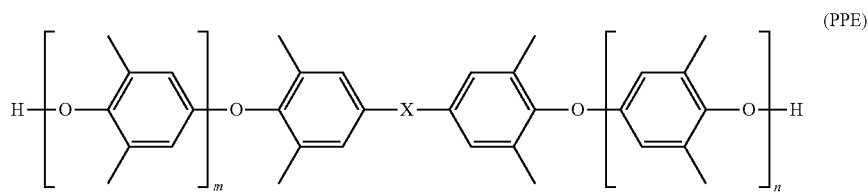

In Formula (PPE), X represents an alkylene group having 1 to 3 carbon atoms or a single bond, m represents an integer of 0 to 20, n represents an integer of 0 to 20, and the sum of m and n represents an integer of 1 to 30.

Examples of the alkylene group in X described above include a dimethylmethylene group.

—Aromatic Polyether Ketone—

The polymer having a dielectric loss tangent of 0.005 or less may be an aromatic polyether ketone.

The aromatic polyether ketone is not particularly limited, and a known aromatic polyether ketone can be used.

The aromatic polyether ketone is preferably a polyether ether ketone.

The polyether ether ketone is one type of the aromatic polyether ketone, and is a polymer in which bonds are arranged in the order of an ether bond, an ether bond, and a carbonyl bond (ketone). It is preferable that the bonds are linked to each other by a divalent aromatic group.

The aromatic polyether ketone may be used alone or in combination of two or more thereof.

Examples of the aromatic polyether ketone include polyether ether ketone (PEEK) having a chemical structure represented by Formula (P1), polyether ketone (PEK) having a chemical structure represented by Formula (P2), polyether ketone ketone (PEKK) having a chemical structure represented by Formula (P3), polyether ether ketone ketone (PEEKK) having a chemical structure represented by Formula (P4), and polyether ketone ether ketone ketone (PEKEKK) having a chemical structure represented by Formula (P5).

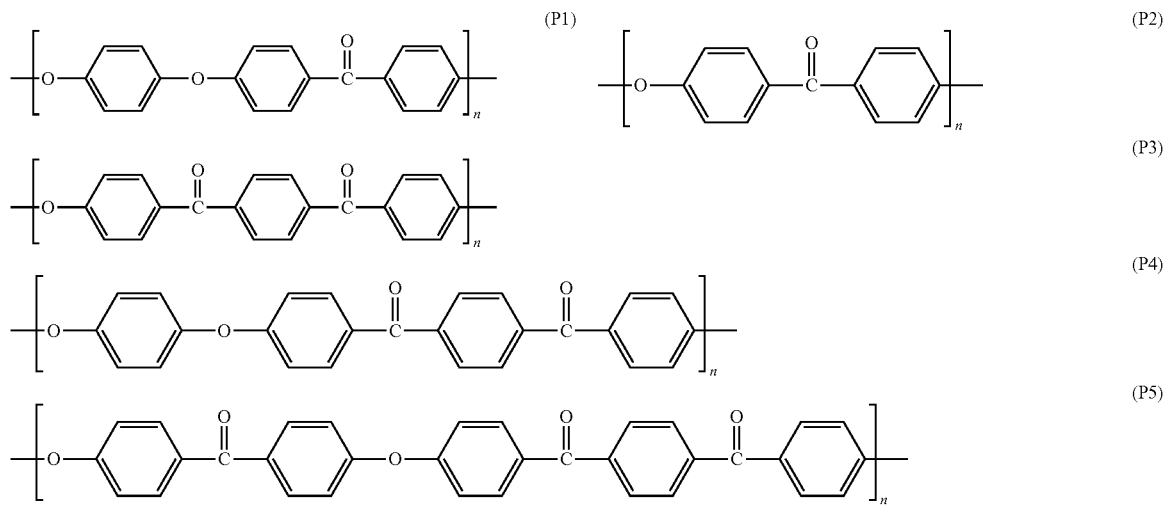

From the viewpoint of mechanical properties, each n of Formulae (P1) to (P5) is preferably 10 or more and more preferably 20 or more. On the other hand, from the viewpoint that the aromatic polyether ketone can be easily produced, n is preferably 5,000 or less and more preferably 1,000 or less. That is, n is preferably 10 to 5,000 and more preferably 20 to 1,000.

The polymer having a dielectric loss tangent of 0.01 or less or 0.005 or less is preferably a polymer soluble in a specific organic solvent (hereinafter, also referred to as "soluble polymer").

Specifically, the soluble polymer in the present disclosure is a liquid crystal polymer in which 0.1 g or more thereof is dissolved at 25° C. in 100 g of at least one solvent selected from the group consisting of N-methylpyrrolidone, N-ethylpyrrolidone, dichloromethane, dichloroethane, chloroform, N,N-dimethylacetamide, γ-butyrolactone, dimethylformamide, ethylene glycol monobutyl ether, and ethylene glycol monoethyl ether.

The layer B may contain only one kind of the polymer having a dielectric loss tangent of 0.01 or less or 0.005 or less or the liquid crystal polymer, or may contain two or more kinds thereof.

From the viewpoint of dielectric loss tangent of the polymer film and adhesiveness with a metal, a content of the polymer having a dielectric loss tangent of 0.01 or less or 0.005 or less or the liquid crystal polymer in the layer B is preferably 10% by mass to 99% by mass, more preferably 20% by mass to 95% by mass, still more preferably 30% by mass to 90% by mass, and particularly preferably 40% by mass to 80% by mass with respect to the total mass of the polymer film.

From the viewpoint of dielectric loss tangent of the polymer film and adhesiveness with a metal, the content of the polymer having a dielectric loss tangent of 0.01 or less or 0.005 or less or the liquid crystal polymer in the polymer film is preferably 20% by mass to 99% by mass, more preferably 30% by mass to 98% by mass, still more preferably 40% by mass to 97% by mass, and particularly preferably 50% by mass to 95% by mass with respect to the total mass of the polymer film.

[Compound Having Functional Group]

The layer B contains a compound having a functional group, in which the functional group is at least one group selected from the group consisting of a covalent-bondable group, an ion-bondable group, a hydrogen-bondable group, a dipole-interactable group, and a curing reactive group.

It is presumed that the adhesiveness with a metal is improved because the compound having a functional group contained in the layer B interacts with or is bonded to the metal or a group present in a surface of the metal.

In addition, the above-described compound having a functional group interacts with, is bonded to, or forms an entanglement with the polymer having a dielectric loss tangent of 0.01 or less or 0.005 or less or the liquid crystal polymer contained in the layer B. Examples of the entanglement include an aspect in which a continuous phase of the compound having a functional group and a continuous phase of the polymer having a dielectric loss tangent of 0.01 or less or 0.005 or less or the liquid crystal polymer interpenetrate each other, and an aspect in which a friction coefficient increases due to the morphology of each continuous phase.

In a laminate described later, in a case where the metal layer to be brought into contact with the layer B is surface-treated, a functional group capable of interacting with or being bonded to a group present in the surface of the metal is preferable.

In the case of the aspect in which the compound having a functional group and the polymer having a dielectric loss tangent of 0.01 or less or 0.005 or less or the liquid crystal polymer interpenetrate each other, the compound having a functional group is preferably a compound which undergoes phase separation from the polymer having a dielectric loss tangent of 0.01 or less or 0.005 or less or the liquid crystal polymer; or a compound which undergoes phase separation from the polymer having a dielectric loss tangent of 0.01 or less or 0.005 or less or the liquid crystal polymer in a process in which the compounds having a functional group are bonded to each other, or as a result that the compounds having a functional group are bonded to each other. With the above-described aspect, the adhesiveness between the layer B and the metal is improved.

From the viewpoint of adhesiveness between the layer B and the layer A, it is preferable that the layer A and the layer B contain a common polymer having a dielectric loss tangent of 0.01 or less or 0.005 or less or a common liquid crystal polymer, that each layer has a small surface energy difference, or that each layer has a small solubility parameter difference.

In addition, by bonding the compound having a functional group to the component contained in the layer A (for example, the polymer having a dielectric loss tangent of 0.01 or less or 0.005 or less or the liquid crystal polymer), the adhesiveness between the layer B and the layer A can also be improved.

The compound having a functional group may be a low-molecular-weight compound or a high-molecular-weight compound.

From the viewpoint of compatibility between the polymer having a dielectric loss tangent of 0.005 or less and the compound having a functional group and viewpoint of dielectric loss tangent of the polymer film, the compound having a functional group is preferably a low-molecular-weight compound, and from the viewpoint of heat resistance of the polymer film and mechanical strength, the compound having a functional group is preferably a high-molecular-weight compound.

It is sufficient that the number of functional groups in the compound having a functional group is 1 or more, and it may be 2 or more. However, the number of functional groups in the compound having a functional group is preferably 2 or more, and from the viewpoint of reducing the dielectric loss tangent of the polymer film by setting the amount of functional groups to an appropriate amount, it is preferably 10 or less.

In addition, the compound having a functional group may have only one kind of functional group, or two or more kinds of functional groups.

From the viewpoint of adhesiveness with the metal layer, the low-molecular-weight compound used as the compound having a functional group preferably has a molecular weight of 50 or more and less than 2,000, more preferably has a molecular weight of 100 or more and less than 1,000, and particularly preferably has a molecular weight of 200 or more and less than 1,000.

In a case where the compound having a functional group is a low-molecular-weight compound, the spread of the compound is narrow, and in order to increase the contact probability between the functional groups, a content of the compound having a functional group is preferably 10% by mass or more with respect to the total mass of the layer B.

In addition, from the viewpoint of adhesiveness with a metal, the high-molecular-weight compound used as the compound having a functional group is preferably a polymer having a weight-average molecular weight of 1,000 or more, more preferably a polymer having a weight-average molecular weight of 2,000 or more, still more preferably a polymer having a weight-average molecular weight of 3,000 or more and 1,000,000 or less, and particularly preferably a polymer having a weight-average molecular weight of 5,000 or more and 200,000 or less.

Furthermore, from the viewpoint of dielectric loss tangent of the polymer film and adhesiveness with the metal layer, it is preferable that the polymer having a dielectric loss tangent of 0.005 or less and the compound having a functional group are compatible with each other. Here, "compatible with each other" means that phase separation is not observed inside the layer B.

From the viewpoint of compatibility between the polymer having a dielectric loss tangent of 0.005 or less and the compound having a functional group, dielectric loss tangent of the polymer film, and adhesiveness with the metal layer, a difference between an SP value of the polymer having a dielectric loss tangent of 0.005 or less, which is determined by Hoy method, and an SP value of the compound having a functional group, which is determined by Hoy method, is preferably $5 \text{ MPa}^{0.5}$ or less. The lower limit value thereof is $0 \text{ MPa}^{0.5}$.

The solubility parameter value (SP value) determined by Hoy method is calculated from the molecular structure of the resin by the method described in Polymer Handbook fourth edition. In addition, in a case where the resin is a mixture of a plurality types of resins, the SP value is obtained by calculating an SP value of each constitutional unit.

<<Functional Group>>

The functional group in the compound having a functional group is at least one group selected from the group consisting of a covalent-bondable group, an ion-bondable group, a hydrogen-bondable group, a dipole-interactable group, and a curing reactive group.

From the viewpoint of adhesiveness with a metal, the functional group is preferably a covalent-bondable group or a curing reactive group, and more preferably a covalent-bondable group.

In addition, from the viewpoint of storage stability and handleability, the functional group is preferably an ion-bondable group, a hydrogen-bondable group, or a dipole-interactable group.

—Covalent-Bondable Group—

The covalent-bondable group is not particularly limited as long as the group is capable of forming a covalent bond, and examples thereof include an epoxy group, an oxetanyl group, an isocyanate group, an acid anhydride group, a carbodiimide group, a N-hydroxy ester group, a glyoxal group, an imide ester group, a halogenated alkyl group, a thiol group, a hydroxy group, a carboxy group, an amino group, an amide group, an isocyanate group, an aldehyde group, and a sulfonic acid group. Among these, from the viewpoint of adhesiveness with the metal layer, the covalent-bondable group is preferably at least one functional group selected from the group consisting of an epoxy group, an oxetanyl group, an N-hydroxy ester group, an isocyanate group, an imide ester group, a halogenated alkyl group, and a thiol group, and particularly preferably an epoxy group.

In addition, as will be described later, it is preferable that the surface of the metal to be bonded has a group which is paired with the functional group in the compound having a functional group.

Specific examples of a combination of the covalent-bondable groups (a combination of the functional group in the compound having a functional group and the group present in the surface of the metal) include an aspect in which, for example, in a case where one is an epoxy group or an oxetanyl group, the other is a hydroxy group or an amino group.

Examples thereof also include an aspect in which, for example, in a case where one is an N-hydroxy ester group or an imide ester group, the other is an amino group.

—Ion-Bondable Group—

Examples of the ion-bondable group include a cationic group and an anionic group.

The above-described cationic group is preferably an onium group. Examples of the onium group include an ammonium group, a pyridinium group, a phosphonium group, an oxonium group, a sulfonium group, a selenonium group, and an iodonium group. Among these, from the viewpoint of adhesiveness with the metal layer, an ammonium group, a pyridinium group, a phosphonium group, or a sulfonium group is preferable, an ammonium group or a phosphonium group is more preferable, and an ammonium group is particularly preferable.

The anionic group is not particularly limited, and examples thereof include a phenolic hydroxyl group, a carboxy group, —SO$_3$H, —OSO$_3$H, —POSH, —OPO$_3$H$_2$, —CONHSO$_2$—, and —SO$_2$NHSO$_2$—. Among these, a phosphoric acid group, a phosphonic acid group, a phosphinic acid group, a sulfuric acid group, a sulfonic acid group, a sulfinic acid group, or a carboxy group is preferable, a phosphoric acid group or a carboxy group is more preferable, and a carboxy group is still more preferable.

Specific examples of a combination of the ion-bondable groups (a combination of the functional group in the compound having a functional group and the group present in the surface of the metal) include an aspect in which, for example, in a case where one is an acidic group, the other is a basic group.

Examples of the above-described acidic group include a carboxy group, a sulfo group, and a phosphoric acid group, and a carboxy group is preferable.

In addition, examples thereof include an aspect in which, for example, in a case where one is a carboxy group, the ion-bondable group with the carboxy group is a tertiary amino group, a pyridyl group, or a piperidyl group.

—Hydrogen-Bondable Group—

Examples of the hydrogen-bondable group include a group having a hydrogen-bond-donating moiety and a group having a hydrogen-bond-accepting moiety.

It is sufficient that the hydrogen-bond-donating moiety has a structure having an active hydrogen atom capable of hydrogen bonding, and a structure represented by X—H is preferable.

X represents a heteroatom, and is preferably a nitrogen atom or an oxygen atom.

From the viewpoint of adhesiveness with the metal layer, as the above-described hydrogen-bond-donating moiety, at least one structure selected from the group consisting of a hydroxy group, a carboxy group, a primary amide group, a secondary amide group, a primary amino group, a secondary amino group, a primary sulfonamide group, a secondary sulfonamide group, an imide group, a urea bond, and a urethane bond is preferable; at least one structure selected from the group consisting of a hydroxy group, a carboxy group, a primary amide group, a secondary amide group, a primary sulfonamide group, a secondary sulfonamide group, a maleimide group, a urea bond, and a urethane bond is more preferable; at least one structure selected from the group consisting of a hydroxy group, a carboxy group, a primary amide group, a secondary amide group, a primary sulfonamide group, a secondary sulfonamide group, and a maleimide group is still more preferable; and at least one structure selected from the group consisting of a hydroxy group and a secondary amide group is particularly preferable.

The above-described hydrogen-bond-accepting moiety may be a structure containing an atom with an unshared electron pair, and a structure containing an oxygen atom with an unshared electron pair is preferable; at least one structure selected from the group consisting of a carbonyl group (including a carbonyl structure such as a carboxy group, an amide group, an imide group, a urea bond, and a urethane bond) and a sulfonyl group (including a sulfonyl structure such as a sulfonamide group) is more preferable; and a carbonyl group (including a carbonyl structure such as a carboxy group, an amide group, an imide group, a urea bond, and a urethane bond) is particularly preferable.

As the hydrogen-bondable group, a group having both the hydrogen-bond-donating moiety and the hydrogen-bond-accepting moiety described above is preferable; it is preferable to have a carboxy group, an amide group, an imide group, a urea bond, a urethane bond, or a sulfonamide group, and it is more preferable to have a carboxy group, an amide group, an imide group, or a sulfonamide group.

Specific examples of a combination of the hydrogen-bondable groups (a combination of the functional group in the compound having a functional group and the group present in the surface of the metal) include an aspect in which, in a case where one is a group having a hydrogen-bond-donating moiety, the other is a group having a hydrogen-bond-accepting moiety.

Examples thereof include an aspect in which, in a case where one is a carboxy group, the other is an amide group or a carboxy group.

Examples thereof also include an aspect in which, in a case where one is a phenolic hydroxyl group, the other is a phenolic hydroxide.

—Dipole-Interactable Group—

It is sufficient that the dipole-interactable group is a group having a polarized structure other than the above-described structure represented by X-H (X represents a heteroatom, for example, a nitrogen atom or an oxygen atom) in the hydrogen-bondable group, and suitable examples thereof include a group in which atoms with different electronegativities are bonded to each other.

As a combination of the atoms with different electronegativities, a combination of at least one atom selected from the group consisting of an oxygen atom, a nitrogen atom, a sulfur atom, and a halogen atom, and a carbon atom is preferable; and a combination of at least one atom selected from the group consisting of an oxygen atom, a nitrogen atom, and a sulfur atom, and a carbon atom is more preferable.

Among these, from the viewpoint of adhesiveness with the metal layer, a combination of a nitrogen atom and a carbon atom or a combination of a carbon atom, a nitrogen atom, an oxygen atom, and a sulfur atom is preferable, and specifically, a cyano group, a cyanuric group, or a sulfonic acid amide group is more preferable.

Preferred examples of a combination of the dipole-interactable groups (a combination of the functional group in the compound having a functional group and the group present in the surface of the metal) include a combination of identical dipole-interactable groups.

Examples thereof include an aspect in which, in a case where one is a cyano group, the other is a cyano group.

Examples thereof also include an aspect in which, in a case where one is a sulfonic acid amide group, the other is a sulfonic acid amide group.

—Curing Reactive Group—

Preferred examples of the compound having a curing reactive group include the following curable compound. In addition, in a case where the layer B contains a curable compound, it is preferable that the layer B contains the curable compound and a curing aid.

—Curable Compound—

The curable compound is a compound which is cured by irradiation with heat or light (for example, visible light, ultraviolet rays, near-infrared rays, far-infrared rays, electron beam, or the like), may require a curing aid described later. Examples of such a curable compound include an epoxy compound, a cyanate ester compound, a vinyl compound, a silicone compound, an oxazine compound, a maleimide compound, an allyl compound, an acrylic compound, a methacrylic compound, and a urethane compound. These may be used alone or in combination of two or more thereof. Among these, from the viewpoint of characteristics such as compatibility with the above-described polymer and heat resistance, at least one selected from the group consisting of an epoxy compound, a cyanate ester compound, a vinyl compound, a silicone compound, an oxazine compound, a maleimide compound, and an allyl compound is preferable; and at least one selected from the group consisting of an epoxy compound, a cyanate ester compound, a vinyl compound, an allyl compound, and a silicone compound is more preferable.

A content of the curable compound in the layer B is preferably 10% by mass or more and 90% by mass or less, and more preferably 20% by mass or more and 80% by mass or less with respect to the total mass of the layer B.

—Curing Aid—

Examples of the curing aid include polymerization initiators such as a photoreaction initiator (a photoradical generator, a photoacid generator, or a photobase generator). Specific examples of the curing aid include an onium salt compound, a sulfone compound, a sulfonate compound, a sulfonimide compound, a disulfonyldiazomethane compound, a disulfonylmethane compound, an oximesulfonate compound, a hydrazinesulfonate compound, a triazine compound, a nitrobenzyl compound, a benzylimidazole compound, organic halides, octylic acid metal salt, and disulfone. These curing aids may be used alone or in combination of two or more thereof, regardless of the type.

A content of the curing aid in the layer B is preferably 5% by mass or more and 20% by mass or less, and more preferably 5% by mass or more and 10% by mass or less with respect to the total mass of the layer B.

As the functional group in the compound having a functional group, specifically, it is preferable to have an epoxy group, an oxetanyl group, an isocyanate group, an acid anhydride group, a carbodiimide group, an N-hydroxy ester group, a glyoxal group, an imidoester group, a halogenated alkyl group, a thiol group, a hydroxy group, a carboxy group, an amino group, an amide group, an isocyanate group, an aldehyde group, a sulfuric acid group, a sulfonic acid group, an ammonium group, a pyridinium group, a phosphonium group, an oxonium group, a sulfonium group, a selenonium group, an iodonium group, a phosphoric acid group, a phosphonic acid group, a phosphinic acid group, a sulfonic acid group, or at least one selected from the group consisting of a sulfinic acid group or a carboxy group, a hydroxy group, a carboxy group, a primary amide group, a secondary amide group, a primary amino group, a secondary amino group, a primary sulfonamide group, a secondary sulfonamide group, an imide group, a urea bond, and a urethane bond. From the viewpoint of improving the adhesiveness, an epoxy group, an oxetanyl group, an isocyanate group, an acid anhydride group, a carbodiimide group, an N-hydroxy ester group, a glyoxal group, an imidoester group, a halogenated alkyl group, or a thiol group is more preferable.

Specific examples of the bonds or interaction between two kinds of the functional groups are described below, but the bonds or interaction in the present disclosure is not limited thereto.

Covalent bond

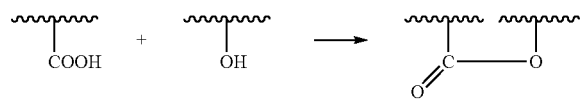

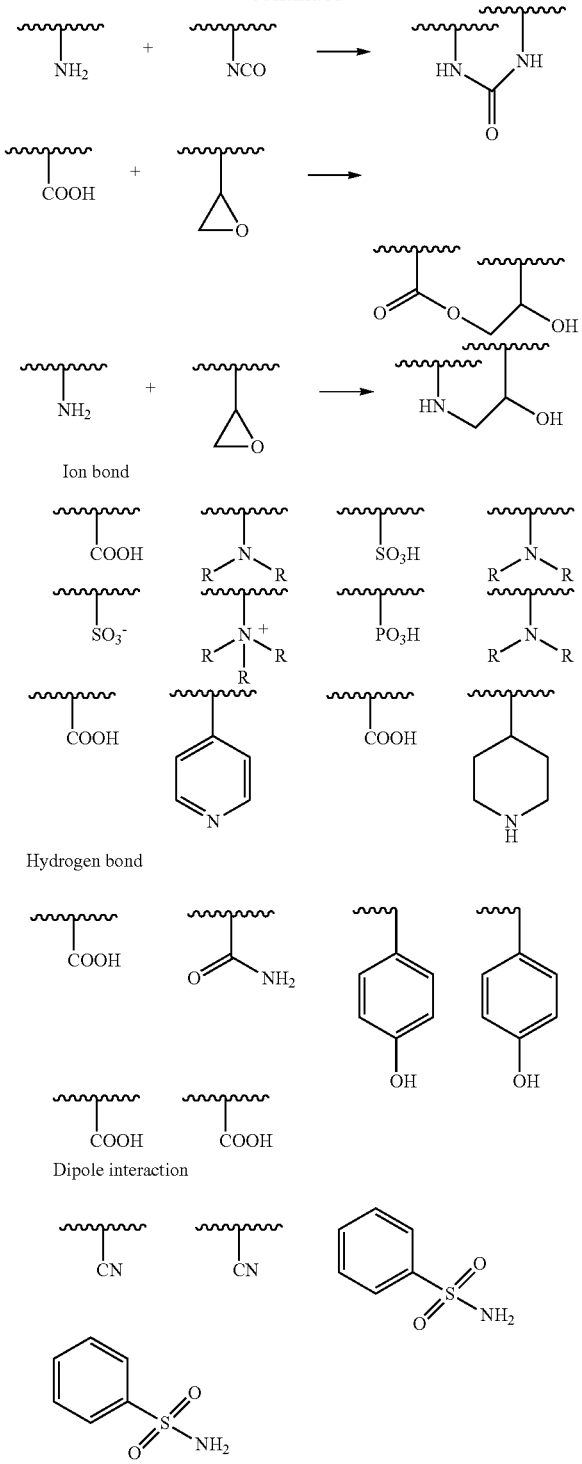

From the viewpoint of dielectric loss tangent of the polymer film and adhesiveness with a metal, the compound having a functional group is preferably a polyfunctional epoxy compound or a polymer of a polyfunctional epoxy compound, more preferably a bifunctional epoxy compound or a polymer of a bifunctional epoxy compound, and particularly preferably a bifunctional epoxy compound.

The layer B may contain only one or two or more kinds of the compounds having a functional group.

It is preferable that a content proportion of the compound having a functional group in the layer B is higher than a content proportion of the compound having a functional group in the layer A.

From the viewpoint of dielectric loss tangent of the polymer film and adhesiveness with a metal, a content of the compound having a functional group in the layer B is preferably 1% by mass to 80% by mass, more preferably 5% by mass to 70% by mass, still more preferably 10% by mass to 60% by mass, and particularly preferably 20% by mass to 60% by mass with respect to the total mass of the polymer film.

From the viewpoint of dielectric loss tangent of the polymer film and adhesiveness with a metal, the content of the compound having a functional group in the polymer film is preferably 0.5% by mass to 80% by mass, more preferably 1% by mass to 70% by mass, still more preferably 2% by mass to 60% by mass, and particularly preferably 3% by mass to 60% by mass with respect to the total mass of the polymer film.

—Three-Dimensional Crosslinking Structure—

From the viewpoint of dielectric loss tangent of the polymer film, adhesiveness with a metal, heat resistance, and mechanical strength, the layer B preferably has a three-dimensional crosslinking structure.

Examples of a method for forming the three-dimensional crosslinking structure include an aspect in which at least one selected from the group consisting of the polymer having a dielectric loss tangent of 0.005 or less and the compound having a functional group is a cured substance of a polyfunctional reactive compound. Here, the cured substance of a polyfunctional reactive compound means a compound in which a reactive group in the polyfunctional reactive compound has substantially lost its reactivity due to various curing reactions such as a crosslinking reaction and a polymerization reaction. That is, a part of the reactive groups in the polyfunctional reactive compound may be unreactive, and for example, it is sufficient that 50% or more of all reactive groups in the polyfunctional reactive compound disappears. A proportion of the disappearance of the reactive group in the polyfunctional reactive compound is preferably 80% or more, more preferably 90% or more, and still more preferably 100% (that is, in a state in which all reactive groups in the polyfunctional reactive compound disappear). The degree of disappearance of the reactive group can be measured by a known method, and examples thereof include a method of identifying the cured substance of a polyfunctional reactive compound, contained in the polymer film, and measuring the cured substance by infrared absorption spectrum and the like.

In addition, in the polymer film according to the embodiment of the present disclosure, preferably as the polymer having a dielectric loss tangent of 0.005 or less, from the viewpoint of dielectric loss tangent of the polymer film, adhesiveness with the metal layer, heat resistance, and mechanical strength, it is preferable to contain a polyfunctional reactive compound, and it is more preferable to contain a precursor of a liquid crystal polymer.

The precursor of a liquid crystal polymer is not particularly limited as long as it is a polymerizable liquid crystal polymer. The precursor of a liquid crystal polymer may be one in which a polymerizable group is generated by a predetermined treatment (for example, an annealing treatment and a surface treatment such as plasma) during manufacturing the polymer film, or a polymer precursor itself may have a polymerizable group.

Furthermore, in the polymer film according to the embodiment of the present disclosure, as the compound having a functional group, from the viewpoint of dielectric loss tangent of the polymer film, adhesiveness with the metal layer, heat resistance, and mechanical strength, it is preferable to contain a cured substance of a polyfunctional reactive compound, it is more preferable to contain a polymer of a polyfunctional epoxy compound, and it is particularly preferable to contain a polymer of a bifunctional epoxy compound.

In addition, preferred examples of the polyfunctional reactive compound include a polyfunctional ethylenically unsaturated compound, and more preferred examples thereof include a polyfunctional styrene compound.

The cured substance of a polyfunctional reactive compound may be a homopolymer of the polyfunctional reactive compound, a copolymer of two or more polyfunctional reactive compounds, or a copolymer of one or more polyfunctional reactive compounds and one or more monofunctional reactive compounds.

The cured substance of a polyfunctional reactive compound is not particularly limited, but is preferably an addition polymerization resin.

In addition, in the polymerization of the precursor of a liquid crystal polymer having a polymerizable group and in the formation of the cured substance of a polyfunctional reactive compound, it is preferable to use a polymerization initiator. As the polymerization initiator, a known photopolymerization initiator, a known thermal polymerization initiator, or the like can be used.

—Filler—

From the viewpoint of thermal expansion coefficient and adhesiveness with the metal layer, the layer B may contain a filler.

The filler may be particulate or fibrous, and may be an inorganic filler or an organic filler.

In the polymer film according to the embodiment of the present disclosure, from the viewpoint of thermal expansion coefficient and adhesiveness with the metal layer, it is preferable that a number density of the above-described filler is higher inside the above-described polymer film than on the surface of the above-described polymer film.

Here, the surface of the polymer film refers to an outer surface (a surface in contact with air or the substrate) of the polymer film, and the smaller of a range of 3 μm in a depth direction from the most surface and a range of 10% or less of the thickness of the entire polymer film from the most surface is defined as the "surface". The inside of the polymer film refers to a portion other than the surface of the polymer film, that is, an inner surface of the polymer film (a surface which is not in contact with air or the substrate), which is not limited. The smaller numerical value of a range of ±1.5 μm from a center of the polymer film in a thickness direction and a range of ±5% of the total thickness of the polymer film from the center in the thickness direction is defined as the "inside".

As the inorganic filler, a known inorganic filler can be used.

Examples of a material of the inorganic filler include BN, $Al_2O_3$, AlN, $TiO_2$, $SiO_2$, barium titanate, strontium titanate, aluminum hydroxide, calcium carbonate, and a material containing two or more of these.

Among these, as the inorganic filler, from the viewpoint of thermal expansion coefficient and adhesiveness with the metal layer, metal oxide particles or fibers are preferable, silica particles, titania particles, or glass fibers are more preferable, and silica particles or glass fibers are particularly preferable.

An average particle diameter of the inorganic filler is preferably approximately 20% to approximately 40% of the thickness of the layer A, and for example, the average particle diameter may be selected from 25%, 30%, or 35% of the thickness of the layer A. In a case where the particles or fibers are flat, the average particle diameter indicates a length in a short side direction.

In addition, from the viewpoint of thermal expansion coefficient and adhesiveness with the metal layer, the average particle diameter of the inorganic filler is preferably 5 nm to 20 μm, more preferably 10 nm to 10 μm, still more preferably 20 nm to 1 μm, and particularly preferably 25 nm to 500 nm.

As the organic filler, a known organic filler can be used.

Examples of a material of the organic filler include polyethylene, polystyrene, urea-formalin filler, polyester, cellulose, acrylic resin, fluororesin, cured epoxy resin, crosslinked benzoguanamine resin, crosslinked acrylic resin, a liquid crystal polymer, and a material containing two or more kinds of these.

In addition, the organic filler may be fibrous, such as nanofibers, or may be hollow resin particles.

Among these, as the organic filler, from the viewpoint of thermal expansion coefficient and adhesiveness with a metal, fluororesin particles, polyester-based resin particles, polyethylene particles, liquid crystal polymer particles, or cellulose-based resin nanofibers are preferable, and polytetrafluoroethylene particles, polyethylene particles, or liquid crystal polymer particles are more preferable. Here, the liquid crystal polymer particles are not limited, but refer to particles obtained by polymerizing a liquid crystal polymer and crushing the liquid crystal polymer with a crusher or the like to obtain powdery liquid crystal. The liquid crystal polymer particles are preferably smaller than the thickness of each layer.

From the viewpoint of thermal expansion coefficient and adhesiveness with the metal layer, an average particle diameter of the organic filler is preferably 5 nm to 20 μm, more preferably 10 nm to 1 μm, still more preferably 20 nm to 500 nm, and particularly preferably 25 nm to 90 nm.

The layer B may contain only one or two or more kinds of the fillers.

From the viewpoint of adhesiveness with the metal layer, it is preferable that a content of the filler in the layer B is smaller than a content of the filler in the layer A.

In addition, from the viewpoint of adhesiveness with the metal layer, it is preferable that the layer B does not contain the filler or the content of the filler in the layer B is more than 0% by volume and 20% by volume or less with respect to the total volume of the layer B; it is more preferable that the layer B does not contain the filler or the content of the filler in the layer B is more than 0% by volume and 10% by volume or less with respect to the total volume of the layer B; it is still more preferable that the layer B does not contain the filler or the content of the filler in the layer B is more than 0% by volume and 5% by volume or less with respect to the total volume of the layer B; and it is particularly preferable that the layer B does not contain the filler. The content of the filler in the layer B is preferably 0% by mass to 15% by mass, and more preferably 0% by mass to 5% by mass with respect to the total mass of the layer B.

A content of a filler such as polyethylene and an olefin-based elastomer is, for example, preferably 50% by volume to 90% by volume, and more preferably 75% by volume to 85% by volume. In this case, the content of the filler in the layer B is preferably 55% by mass to 90% by mass, and more preferably 80% by mass to 85% by mass with respect to the total mass of the layer B.

From the viewpoint of thermal expansion coefficient and adhesiveness with the metal layer, the content of the filler in the polymer film is preferably 5% by volume to 80% by volume, more preferably 10% by volume to 70% by volume, still more preferably 15% by volume to 70% by volume, and particularly preferably 20% by volume to 60% by volume with respect to the total volume of the polymer film.

—Other Additives—

The layer B may contain an additive other than the above-described components.

Known additives can be used as other additives. Specific examples of the other additives include a leveling agent, an antifoaming agent, an antioxidant, an ultraviolet absorbing agent, a flame retardant, and a colorant.

In addition, the layer B may contain, as the other additives, a resin other than the polymer having a dielectric loss tangent of 0.01 or less or 0.005 or less or the liquid crystal polymer, and the compound having a functional group.

Examples of other resins include thermoplastic resins such as polypropylene, polyamide, polyester, polyphenylene sulfide, polyether ketone, polycarbonate, polyethersulfone, polyphenylene ether and a modified product thereof, and polyetherimide; elastomers such as a copolymer of glycidyl methacrylate and polyethylene; and thermosetting resins such as a phenol resin, an epoxy resin, a polyimide resin, and a cyanate resin.

The total content of the other additives in the layer B is preferably 25 parts by mass or less, more preferably 10 parts by mass or less, and still more preferably 5 parts by mass or less with respect to 100 parts by mass of the content of the polymer having a dielectric loss tangent of 0.005 or less.

In addition, it is preferable that the total content of the other additives in the layer B is smaller than the content of the compound having a functional group.

From the viewpoint of dielectric loss tangent of the polymer film and adhesiveness with a metal, it is preferable that an average thickness of the layer B is smaller than an average thickness of the layer A.

From the viewpoint of dielectric loss tangent of the polymer film and adhesiveness with a metal, a value of TA/TB, which is a ratio of an average thickness TA of the layer A to an average thickness TB of the layer B, is preferably more than 1, more preferably 2 to 100, still more preferably 2.5 to 20, and particularly preferably 3 to 10.

In addition, from the viewpoint of dielectric loss tangent of the polymer film and adhesiveness with a metal, the average thickness of the layer B is preferably 0.1 μm to 20 μm, more preferably 0.5 μm to 15 μm, still more preferably 1 μm to 10 μm, and particularly preferably 3 μm to 8 μm.

A method for measuring the average thickness of each layer in the polymer film according to the embodiment of the present disclosure is as follows.

The thickness of each layer is evaluated by cutting the polymer film with a microtome and observing the cross section with an optical microscope. Three or more sites of the cross-sectional sample are cut out, the thickness is measured at three or more points in each cross section, and the average value thereof is defined as the average thickness.

By including the layer B in the polymer film according to the embodiment of the present disclosure, a polymer film having excellent adhesiveness with a metal is obtained. For example, in a case where the layer A has a filler, it is presumed that, by including the layer B and the layer A brittle due to the addition of the filler, the surface of the polymer film is improved, and effects such as improvement in adhesiveness are obtained.

In addition, the layer B is preferably a surface layer (outermost layer). For example, in a case where the polymer film is used as a laminate (laminated plate with a metal layer) having a layer configuration of metal layer/layer A/layer B, another metal layer or laminated plate with a metal layer may be further disposed on the layer B side. In this case, interface destruction between the layer B and another metal layer in the laminate is suppressed, and the adhesiveness with the metal layer is improved.

In addition, it is preferable that the polymer contained in the layer B contains a polymer having a higher breaking strength (toughness) that the polymer contained in the layer A.

The breaking strength is measured by the following method.

A sample including the polymer to be measured is produced, and using a universal tensile tester "STM T50BP" manufactured by Toyo Baldwin Co., Ltd., a stress against elongation is measured at a tensile rate of 10%/min in an atmosphere of 25° C. and 60% RH to obtain the breaking strength.

<Layer A>

The polymer film according to the embodiment of the present disclosure includes a layer A and a layer B on at least one surface of the layer A.

From the viewpoint of dielectric loss tangent of the polymer film and adhesiveness with the metal layer, the above-described layer A preferably contains a polymer having a dielectric loss tangent of 0.01 or less or 0.005 or less.

Preferred aspects of the polymer having a dielectric loss tangent of 0.01 or less or 0.005 or less, which is used in the layer A, are the same as the preferred aspects of the polymer having a dielectric loss tangent of 0.01 or less or 0.005 or less, which is used in the layer B, except as described below.

The polymer having a dielectric loss tangent of 0.01 or less or 0.005 or less, which is contained in the layer A, may be the same as or different from the polymer having a dielectric loss tangent of 0.005 or less, which is contained in the layer B, but from the viewpoint of adhesiveness between the layer A and the layer B, it is preferable to be the same as the polymer having a dielectric loss tangent of 0.01 or less or 0.005 or less, which is contained in the layer B.

The layer A may contain only one kind of the polymer having a dielectric loss tangent of 0.01 or less or 0.005 or less, or may contain two or more kinds thereof.

It is preferable that a content proportion of the polymer having a dielectric loss tangent of 0.01 or less or 0.005 or less in the layer A is equal to or more than a content proportion of the polymer having a dielectric loss tangent of 0.005 or less in the layer B.

From the viewpoint of dielectric loss tangent of the polymer film and adhesiveness with the metal layer, a content of the polymer having a dielectric loss tangent of 0.01 or less or 0.005 or less in the layer A is preferably 20% by mass to 100% by mass, more preferably 30% by mass to 100% by mass, and particularly preferably 40% by mass to 100% by mass with respect to the total mass of the polymer film.

The layer A may contain a compound having a functional group.

Preferred aspects of the compound having a functional group, which is used in the layer A, are the same as the preferred aspects of the compound having a functional group, which is used in the layer B, except as described below.

The compound having a functional group, which is contained in the layer A, may be the same as or different from the compound having a functional group, which is contained in the layer B.

The layer A may contain only one or two or more kinds of the compounds having a functional group.

From the viewpoint of dielectric loss tangent of the polymer film and adhesiveness with the metal layer, the content of the compound having a functional group in the polymer film is preferably 0.5% by mass to 80% by mass, more preferably 1% by mass to 70% by mass, still more preferably 2% by mass to 60% by mass, and particularly preferably 3% by mass to 60% by mass with respect to the total mass of the polymer film.

From the viewpoint of dielectric loss tangent of the polymer film and adhesiveness with the metal layer, it is more preferable that the layer A contains a filler.

Preferred aspects of the filler which is used in the layer A are the same as the preferred aspects of the filler which is used in the layer B, except as described below.

The layer A may contain only one or two or more kinds of the fillers.

It is preferable that a content proportion of the filler in the layer A is higher than a content proportion of the filler in the layer B.

From the viewpoint of dielectric loss tangent of the polymer film and adhesiveness with a metal, a content of the filler in the layer A is preferably 5% by volume to 80% by volume, more preferably 10% by volume to 70% by volume, still more preferably 20% by volume to 70% by volume, and particularly preferably 30% by volume to 60% by volume with respect to the total volume of the layer A.

From the viewpoint of dielectric loss tangent of the polymer film, adhesiveness with the metal layer, heat resistance, and mechanical strength, the layer A preferably has a three-dimensional crosslinking structure.

Examples of a method for forming the three-dimensional crosslinking structure include an aspect in which at least one selected from the group consisting of the polymer having a dielectric loss tangent of 0.01 or less or 0.005 or less and the compound having a functional group is a cured substance of a polyfunctional reactive compound.

Preferred aspects of the cured substance of a polyfunctional reactive compound in the layer A are the same as the preferred aspects of the cured substance of a polyfunctional reactive compound in the layer B.

The layer A may contain an additive other than those described above.

Preferred aspects of other additives which are used in the layer A are the same as the preferred aspects of other additives which are used in the layer B, except as described below.

The average thickness of the layer A is not particularly limited, but from the viewpoint of dielectric loss tangent of the polymer film and adhesiveness with the metal layer, the average thickness thereof is preferably 5 µm to 90 µm, more preferably 10 µm to 70 µm, and particularly preferably 15 µm to 50 µm.

<Layer C>

It is preferable that the polymer film according to the embodiment of the present disclosure further includes a layer C, and from the viewpoint of adhesiveness with the metal layer, it is more preferable that the above-described layer B, the above-described layer A, and the layer C are provided in this order.

In a case where a metal layer is present separately from each of the above-described layers, the layer C is preferably a surface layer (outermost layer), and more preferably a surface layer on a side to which the metal is attached.

In addition, in a case where the polymer film according to the embodiment of the present disclosure is used as a laminate having a metal layer (for example, a metal foil or a metal wire), it is preferable that the layer C is disposed between the metal layer and the layer A.

From the viewpoint of dielectric loss tangent of the polymer film and adhesiveness with the metal layer, the layer C preferably contains a polymer having a dielectric loss tangent of 0.01 or less or 0.005 or less.

Preferred aspects of the polymer having a dielectric loss tangent of 0.01 or less or 0.005 or less, which is used in the layer C, are the same as the preferred aspects of the polymer having a dielectric loss tangent of 0.01 or less or 0.005 or less, which is used in the layer A, except as described below.

The liquid crystal polymer which is contained in the layer C may be the same as or different from the polymer having a dielectric loss tangent of 0.01 or less or 0.005 or less, which is contained in the layer A or in the layer B, but from the viewpoint of adhesiveness between the layer A and the layer C, it is preferable to be the same as the polymer having a dielectric loss tangent of 0.01 or less or 0.005 or less, which is contained in the layer A.

From the viewpoint of step followability, the layer C preferably contains a material (for example, polyethylene) which is flexible at a pressing temperature.

In addition, from the viewpoint of adhesiveness with a metal, the layer C preferably contains the above-described compound having a functional group.

From the viewpoint of adhesiveness with a metal, it is preferable that a content of the polymer having a dielectric loss tangent of 0.01 or less or 0.005 or less in the layer C is equal to or less than the content of the polymer having a dielectric loss tangent of 0.01 or less or 0.005 or less in the layer A.

From the viewpoint of dielectric loss tangent of the polymer film and adhesiveness with the metal layer, the content of the polymer having a dielectric loss tangent of 0.01 or less or 0.005 or less in the layer C is preferably 10% by mass to 99% by mass, more preferably 20% by mass to 95% by mass, still more preferably 30% by mass to 90% by mass, and particularly preferably 40% by mass to 80% by mass with respect to the total mass of the polymer film.

The layer C preferably contains a compound having a functional group.

Preferred aspects of the compound having a functional group, which is used in the layer C, are the same as the preferred aspects of the compound having a functional group, which is used in the layer B, except as described below.

The compound having a functional group, which is contained in the layer C, may be the same as or different from the compound having a functional group, which is contained in the layer B.

The layer C may contain only one or two or more kinds of the compounds having a functional group.

It is preferable that a content proportion of the compound having a functional group in the layer C is higher than a content proportion of the compound having a functional group in the layer A.

From the viewpoint of dielectric loss tangent of the polymer film and adhesiveness with the metal layer, a content of the compound having a functional group in the layer C is preferably 1% by mass to 80% by mass, more preferably 5% by mass to 70% by mass, still more preferably 10% by mass to 60% by mass, and particularly preferably 20% by mass to 60% by mass with respect to the total mass of the polymer film.

The layer C may contain a filler.

Preferred aspects of the filler which is used in the layer C are the same as the preferred aspects of the filler which is used in the layer B, except as described below.

A content of the filler in the layer C is not particularly limited and can be arbitrarily set. However, in a case where metal layers are provided on both surfaces of the polymer film, from the viewpoint of adhesiveness with the metal layers, it is preferable that the content of the filler in the layer C is smaller than the content of the filler in the layer A.

In addition, in the case where metal layers are provided on both surfaces of the polymer film, from the viewpoint of adhesiveness with the metal layers, it is preferable that the layer C does not contain the filler or the content of the filler in the layer C is more than 0% by volume and 20% by volume or less with respect to the total volume of the layer C; it is more preferable that the layer C does not contain the filler or the content of the filler in the layer C is more than 0% by volume and 10% by volume or less with respect to the total volume of the layer C; it is still more preferable that the layer C does not contain the filler or the content of the filler in the layer C is more than 0% by volume and 5% by volume or less with respect to the total volume of the layer C; and it is particularly preferable that the layer C does not contain the filler.

The content of the filler in the layer C is preferably 0% by mass to 15% by mass, and more preferably 0% by mass to 5% by mass with respect to the total mass of the layer C.

A content of a filler such as polyethylene and an olefin-based elastomer is, for example, preferably 50% by volume to 90% by volume, and more preferably 75% by volume to 85% by volume. In this case, the content of the filler in the layer C is preferably 55% by mass to 90% by mass, and more preferably 80% by mass to 85% by mass with respect to the total mass of the layer C.

The layer C may have a three-dimensional crosslinking structure.

Preferred aspects of the cured substance of a polyfunctional reactive compound in the layer C are the same as the preferred aspects of the cured substance of a polyfunctional reactive compound in the layer B.

The layer C may contain an additive other than those described above.

Preferred aspects of other additives which are used in the layer C are the same as the preferred aspects of other additives which are used in the layer B, except as described below.

From the viewpoint of dielectric loss tangent of the polymer film and adhesiveness with a metal, it is preferable that an average thickness of the layer C is smaller than an average thickness of the layer A.

From the viewpoint of dielectric loss tangent of the polymer film and adhesiveness with the metal layer, a value of TA/Tc, which is a ratio of the average thickness TA of the layer A to an average thickness Tc of the layer C, is preferably more than 1, more preferably 2 to 100, still more preferably 2.5 to 20, and particularly preferably 3 to 10.

In addition, from the viewpoint of dielectric loss tangent of the polymer film and adhesiveness with the metal layer, a value of Tc/TB, which is a ratio of the average thickness Tc of the layer C to the average thickness TB of the layer B, is preferably 0.2 to 5, more preferably 0.5 to 2, and particularly preferably 0.8 to 1.2.

Furthermore, from the viewpoint of dielectric loss tangent of the polymer film and adhesiveness with the metal layer, the average thickness of the layer C is preferably 0.1 µm to 20 µm, more preferably 0.5 µm to 15 µm, still more preferably 1 µm to 10 µm, and particularly preferably 3 µm to 8 µm.

From the viewpoint of strength and electrical characteristics (characteristic impedance) in a case of being laminated with the metal layer, an average thickness of the polymer film according to the embodiment of the present disclosure is preferably 6 µm to 200 µm, more preferably 12 µm to 100 µm, and particularly preferably 20 µm to 60 µm.

The average thickness of the polymer film is measured at optional five sites using an adhesive film thickness meter, for example, an electronic micrometer (product name, "KG3001A", manufactured by Anritsu Corporation), and the average value of the measured values is defined as the average thickness of the polymer film.

From the viewpoint of dielectric constant, the dielectric loss tangent of the polymer film according to the embodiment of the present disclosure is preferably 0.02 or less, more preferably 0.01 or less, still more preferably 0.005 or less, and particularly preferably more than 0 and 0.003 or less.

<Method of Manufacturing Polymer Film>

[Film Formation]

A method of manufacturing the polymer film according to the embodiment of the present disclosure is not particularly limited, and a known method can be referred to.

Suitable examples of the method of manufacturing the polymer film according to the embodiment of the present disclosure include a co-casting method, a multilayer coating method, and a co-extrusion method. Among these, the co-casting method is particularly preferable for formation of a relatively thin film, and the co-extrusion method is particularly preferable for formation of a thick film.

In a case where the film is manufactured by the co-casting method or the multilayer coating method, it is preferable that the co-casting method or the multilayer coating method is performed by using a composition for forming the layer A, a composition for forming the layer B, a composition for forming the layer C, or the like obtained by dissolving or dispersing components of each layer, such as the polymer having a dielectric loss tangent of 0.01 or less or 0.005 or less or the liquid crystal polymer, and the compound having a functional group, in a solvent.

Examples of the solvent include halogenated hydrocarbons such as dichloromethane, chloroform, 1,1-dichloroethane, 1,2-dichloroethane, 1,1,2,2-tetrachloroethane, 1-chlorobutane, chlorobenzene, and o-dichlorobenzene; halogenated phenols such as p-chlorophenol, pentachlorophenol, and pentafluorophenol; ethers such as diethyl ether, tetrahydrofuran, and 1,4-dioxane; ketones such as acetone and cyclohexanone; esters such as ethyl acetate and γ-butyrolactone; carbonates such as ethylene carbonate and propylene carbonate; amines such as triethylamine; nitrogen-containing heterocyclic aromatic compounds such as pyridine; nitriles such as acetonitrile and succinonitrile; amides such as N,N-dimethylformamide, N,N-dimethylacetamide, and N-methylpyrrolidone; urea compounds such as tetramethylurea; nitro compounds such as nitromethane and nitrobenzene; sulfur compounds such as dimethyl sulfoxide and sulfolane; and phosphorus compounds such as hexamethylphosphoramide and tri-n-butyl phosphate. Among these, two or more kinds thereof may be used in combination.

The solvent preferably contains an aprotic compound (particularly, an aprotic compound having no halogen atom) for low corrosiveness and easiness to handle. A proportion of the aprotic compound to the whole solvent is preferably 50% by mass to 100% by mass, more preferably 70% by mass to 100% by mass, and particularly preferably 90% by mass to 100% by mass. In addition, from the viewpoint of easily dissolving the liquid crystal polymer, as the above-described aprotic compound, it is preferable to contain an amide such as N,N-dimethylformamide, N,N-dimethylacetamide, tetramethylurea, and N-methylpyrrolidone, or an ester such as γ-butyrolactone; and it is more preferable to contain N,N-dimethylformamide, N,N-dimethylacetamide, or N-methylpyrrolidone.

In addition, as the solvent, it is preferable to contain a compound having a dipole moment of 3 to 5, because the above-described polymer such as the liquid crystal polymer can be easily dissolved. A proportion of the compound having a dipole moment of 3 to 5 to the whole solvent is preferably 50% by mass to 100% by mass, more preferably 70% by mass to 100% by mass, and particularly preferably 90% by mass to 100% by mass.

It is preferable to use the compound having a dipole moment of 3 to 5 as the above-described aprotic compound.

In addition, as the solvent, it is preferable to contain a compound having a boiling point of 220° C. or lower at 1 atm, because the solvent is easily removed. A proportion of the compound having a boiling point of 220° C. or lower at 1 atm to the whole solvent is preferably 50% by mass to 100% by mass, more preferably 70% by mass to 100% by mass, and particularly preferably 90% by mass to 100% by mass.

It is preferable to use the compound having a boiling point of 220° C. or lower at 1 atm as the above-described aprotic compound.

In addition, in a case where the polymer film is manufactured by the co-casting method, the multilayer coating method, the co-extrusion method, or the like, a support may be used in the method of manufacturing the polymer film according to the embodiment of the present disclosure. In addition, in a case where the metal layer (metal foil) or the like used in the laminate described later is used as the support, the support may be used as it is without being peeled off.

Examples of the support include a metal drum, a metal band, a glass plate, a resin film, and a metal foil. Among these, a metal drum, a metal band, or a resin film is preferable.

Examples of the resin film include a polyimide (PI) film, and examples of commercially available products thereof include U-PILEX S and U-PILEX R (manufactured by Ube Corporation), KAPTON (manufactured by Du Pont-Toray Co., Ltd.), and IF30, IF70, and LV300 (manufactured by SKC Kolon PI, Inc.).

In addition, the support may have a surface treatment layer formed on the surface so that the support can be easily peeled off. Hard chrome plating, a fluororesin, or the like can be used as the surface treatment layer.

An average thickness of the support is not particularly limited, but is preferably 25 µm or more and 75 µm or less and more preferably 50 µm or more and 75 µm or less.

In addition, a method for removing at least a part of the solvent from a cast or applied film-like composition (a casting film or a coating film) is not particularly limited, and a known drying method can be used.

[Stretching]

In the polymer film according to the embodiment of the present disclosure, stretching can be combined as appropriate from the viewpoint of controlling molecular alignment and adjusting linear expansion coefficient and mechanical properties. The stretching method is not particularly limited, and a known method can be referred to, and the stretching method may be carried out in a solvent-containing state or in a dry film state. The stretching in the solvent-containing state may be carried out by gripping and stretching the film, or may be carried out by utilizing self-contraction due to drying without stretching. The stretching is particularly effective for the purpose of improving the breaking elongation and the breaking strength, in a case where brittleness of the film is reduced by addition of an inorganic filler or the like.

In addition, the method of manufacturing the polymer film according to the embodiment of the present disclosure may optionally include a step of polymerizing with light or heat.

A light irradiation unit and a heat application unit are not particularly limited, and a known light irradiation unit such as a metal halide lamp and a known heat application unit such as a heater can be used.

Light irradiation conditions and heat application conditions are not particularly limited, and the polymerization can be carried out at a desired temperature and time and in a known atmosphere.

[Heat Treatment]

The method of manufacturing the polymer film according to the embodiment of the present disclosure preferably includes a step of heat-treating (annealing) the polymer film.

Specifically, from the viewpoint of dielectric loss tangent and peel strength, the heat treatment temperature in the above-described step of heat-treating is preferably 260° C. to 370° C., more preferably 280° C. to 360° C., and still more preferably 300° C. to 350° C. The heat treatment time is preferably 15 minutes to 10 hours and more preferably 30 minutes to 5 hours.

In addition, the method of manufacturing the polymer film according to the embodiment of the present disclosure may include other known steps as necessary.

<Applications>

The polymer film according to the embodiment of the present disclosure can be used for various applications. Among the various applications, the polymer film can be used suitably as a film for an electronic component such as a printed wiring board and more suitably for a flexible printed circuit board.

In addition, the polymer film according to the embodiment of the present disclosure can be suitably used as a polymer film for metal adhesion.

(Laminate)

The laminate according to the embodiment of the present disclosure may be one in which the polymer film according to the embodiment of the present disclosure is laminated, but it is preferable to include the polymer film according to the embodiment of the present disclosure and a metal layer disposed on a surface of the above-described layer B side of the polymer film, and it is more preferable that the metal layer is a copper layer.

The metal layer disposed on the surface of the above-described layer B side is preferably a metal layer disposed on the surface of the above-described layer B.

In addition, it is preferable that the laminate according to the embodiment of the present disclosure includes the polymer film according to the embodiment of the present disclosure in which the layer B, the layer A, and the layer C are provided in this order, a metal layer disposed on a surface of the above-described layer B side of the polymer film, and a metal layer disposed on a surface of the above-described layer C side of the polymer film; and it is more preferable that both of the metal layers are copper layers.

It is preferable that the metal layer disposed on the surface of the above-described layer C side is a metal layer disposed on the surface of the above-described layer C, and it is more preferable that the metal layer disposed on the surface of the above-described layer B side is a metal layer disposed on the surface of the above-described layer B, and the metal layer disposed on the surface of the above-described layer C side is a metal layer disposed on the surface of the above-described layer C.

In addition, the metal layer disposed on the surface of the above-described layer B side and the metal layer disposed on the surface of the above-described layer C side may be a metal layer having the same material, thickness, and shape, or may be metal layers having different materials, thicknesses, and shapes. From the viewpoint of adjusting the characteristic impedance, the metal layer disposed on the surface of the above-described layer B side and the metal layer disposed on the surface of the above-described layer C side may be metal layers having different materials or thicknesses, or a metal layer may be laminated on only one side of the layer B or the layer C.

Furthermore, from the viewpoint of adjusting the characteristic impedance, preferred examples thereof also include an aspect in which a metal layer is laminated on one side of the layer B or the layer C, and another polymer film is laminated on the other side.

A method of attaching the polymer film according to the embodiment of the present disclosure to the metal layer is not particularly limited, and a known laminating method can be used.

In a case where the above-described metal layer is the above-described copper layer, a peel strength between the above-described polymer film and the above-described copper layer is preferably 0.5 kN/m or more, more preferably 0.7 kN/m or more, still more preferably 0.7 kN/m to 2.0 kN/m, and particularly preferably 0.9 kN/m to 1.5 kN/m.

In the present disclosure, the peel strength between the polymer film and the metal layer (for example, the copper layer) is measured by the following method.

A peeling test piece with a width of 1.0 cm is produced from the laminate of the polymer film and the metal layer, the polymer film is fixed to a flat plate with double-sided adhesive tape, and the strength (kN/m) in a case of peeling the polymer film off from the metal layer at a rate of 50 mm/min is measured by the 180° method in conformity with JIS C 5016 (1994).

From the viewpoint of reducing transmission loss of high-frequency signal, a surface roughness Rz of the above-described metal layer on the side in contact with the above-described polymer film is preferably less than 1 μm, more preferably 0.5 μm or less, and particularly preferably 0.3 μm or less.

Since it is preferable that the surface roughness Rz of the above-described metal layer is as small as possible, the lower limit value thereof is not particularly set, but may be, for example, 0 or more.

The "surface roughness Rz" in the present disclosure refers to a value expressed in micrometer, which is the total value of the maximum value of height of peak and the maximum value of depth of valley observed on a roughness curve over the reference length.

In the present disclosure, the surface roughness Rz of the metal layer (for example, the copper layer) is measured by the following method.

Using a noncontact surface/layer cross-sectional shape measurement system VertScan (manufactured by MITSUBISHI CHEMICAL SYSTEMS, Inc.), a square of 465.48 μm in length and 620.64 μm in width is measured to create a roughness curve on the surface of the measurement object (metal layer) and create an average line of the roughness curve. A portion corresponding to the reference length is extracted from the roughness curve. The surface roughness Rz of the measurement object is measured by obtaining the total value of the maximum value of height of peak (that is, height from the average line to summit) and the maximum value of depth of valley (that is, height from the average line to valley bottom) observed in the extracted roughness curve.

The metal layer is preferably a copper layer. As the copper layer, a rolled copper foil formed by a rolling method or an electrolytic copper foil formed by an electrolytic method is preferable.

An average thickness of the metal layer, preferably the copper layer, is not particularly limited, but is preferably 2 μm to 20 μm, more preferably 3 μm to 18 μm, and still more preferably 5 μm to 12 μm. The copper foil may be copper foil with a carrier formed on a support (carrier) so as to be peelable. As the carrier, a known carrier can be used. An average thickness of the carrier is not particularly limited, but is preferably 10 μm to 100 μm and more preferably 18 μm to 50 μm.

In addition, from the viewpoint of further exerting the effects of the present disclosure, the above-described metal layer preferably has a known surface treatment layer (for example, a chemical treatment layer) on the surface of the side in contact with the polymer film to ensure adhesion to the resin. In addition, it is preferable that the above-described interactable group is a group corresponding to the functional group of the compound having a functional group, which is contained in the above-described polymer film, such as an amino group and an epoxy group, and a hydroxy group and an epoxy group.

Examples of the interactable group include a group mentioned as the functional group in the above-described compound having a functional group.

Among these, from the viewpoint of adhesiveness and ease of performing a treatment, a covalent-bondable group is preferable, an amino group or a hydroxy group is more preferable, and an amino group is particularly preferable.

The metal layer in the laminate according to the embodiment of the present disclosure may be a metal layer having a circuit pattern.

It is also preferable that the metal layer in the laminate according to the embodiment of the present disclosure is processed into, for example, a desired circuit pattern by etching to form a flexible printed circuit board. The etching method is not particularly limited, and a known etching method can be used.

EXAMPLES

Hereinafter, the present disclosure will be described in more detail with reference to examples. The materials, the used amounts, the proportions, the treatment contents, the treatment procedures, and the like described in the following examples can be appropriately changed without departing from the gist of the present disclosure. Therefore, the scope of the present disclosure is not limited to the following specific examples.

<<Measurement Method>>

[Dielectric Loss Tangent]

A dielectric constant was measured by a resonance perturbation method at a frequency of 10 GHz. A 10 GHz cavity resonator (CP531 manufactured by Kanto Electronics Application & Development Inc.) was connected to a network analyzer ("E8363B" manufactured by Agilent Technology), and a sample (width: 2 mm x length: 80 mm) was inserted into the cavity resonator, and the dielectric constant and dielectric loss tangent of the sample were measured based on a change in resonance frequency for 96 hours before and after the insertion in an environment of a temperature of 25° C. and a humidity of 60% RH. In a case where a metal layer was laminated on the polymer film, the metal layer was etched and the evaluation was performed using only the polymer film taken out.

[Peel Strength]

A peeling test piece with a width of 1.0 cm was produced from the laminate of the polymer film and the copper layer, the polymer film was fixed to a flat plate with double-sided adhesive tape, and the strength (kN/m) in a case of peeling the polymer film off from the copper layer at 25° C. and a rate of 50 mm/min was measured by the 180° method in conformity with JIS C 5016 (1994). In a case of a laminate in which the copper layers were disposed on both surfaces of the polymer film, the peel strength of both surfaces was evaluated, and the lower value is shown in Table 1.

Production Example

<Polymer Having Dielectric Loss Tangent of 0.01 or Less or 0.005 or Less or Liquid Crystal Polymer>

LC-A: Liquid crystal polymer produced by production method described below

—Production of LC-A—

940.9 g (5.0 mol) of 6-hydroxy-2-naphthoic acid, 377.9 g (2.5 mol) of 4-hydroxyacetaminophen, 415.3 g (2.5 mol) of isophthalic acid, and 867.8 g (8.4 mol) of acetic acid anhydride were added to a reactor provided with a stirrer, a torque meter, a nitrogen gas introduction pipe, a thermometer, and a reflux condenser, the gas inside the reactor was replaced with nitrogen gas, and the mixture was heated from room temperature (23° C.) to 140° C. over 60 minutes while being stirred in a nitrogen gas stream and was refluxed at 140° C. for 3 hours.

Thereafter, the mixture was heated from 150° C. to 300° C. over 5 hours while distilling off by-product acetic acid and unreacted acetic acid anhydride and maintained at 300° C. for 30 minutes, and the resultant was taken out from the reactor and cooled to room temperature. The obtained solid matter was crushed with a crusher, thereby obtaining powdery liquid crystal polyester (B1). The flow start temperature of the liquid crystal polyester (B1) was 193.3° C.

The liquid crystal polyester (B1) obtained above was heated from room temperature to 160° C. over 2 hours and 20 minutes in a nitrogen atmosphere, further heated from 160° C. to 180° C. over 3 hours and 20 minutes, maintained at 180° C. for 5 hours to carry out solid phase polymerization, cooled, and crushed with a crusher, thereby obtaining powdery liquid crystal polyester (B2). The flow start temperature of the liquid crystal polyester (B2) was 220° C.

The liquid crystal polyester (B2) obtained above was heated from room temperature (23° C.) to 180° C. over 1 hour and 25 minutes in a nitrogen atmosphere, further heated from 180° C. to 255° C. over 6 hours and 40 minutes, maintained at 255° C. for 5 hours to carry out solid phase polymerization, and cooled, thereby obtaining powdery liquid crystal polyester (LC-A). A flow start temperature of LC-A was 302° C. In addition, as a result of measuring a melting point of the LC-A using a differential scanning calorimetry device, the measured value was 311° C.

LC-C: Liquid crystal polymer produced by production method described below

—Production of LC-C—

940.9 g (5.0 mol) of 6-hydroxy-2-naphthoic acid, 377.9 g (2.5 mol) of 4-hydroxyacetaminophen, 415.3 g (2.5 mol) of isophthalic acid, and 867.8 g (8.4 mol) of acetic acid anhydride were added to a reactor provided with a stirrer, a torque meter, a nitrogen gas introduction pipe, a thermometer, and a reflux condenser, the gas inside the reactor was replaced with nitrogen gas, and the mixture was heated from room temperature (23° C.) to 143° C. over 60 minutes while being stirred in a nitrogen gas stream and was refluxed at 143° C. for 1 hour.

Thereafter, the mixture was heated from 150° C. to 300° C. over 5 hours while distilling off by-product acetic acid and unreacted acetic acid anhydride and maintained at 300° C. for 30 minutes, and the resultant was taken out from the reactor and cooled to room temperature. The obtained solid matter was crushed with a crusher, thereby obtaining powdery liquid crystal polyester (C1).

The liquid crystal polyester (C1) obtained above was heated from room temperature to 160° C. over 2 hours and 20 minutes in a nitrogen atmosphere, further heated from 160° C. to 180° C. over 3 hours and 20 minutes, maintained at 180° C. for 5 hours to carry out solid phase polymerization, cooled, and crushed with a crusher, thereby obtaining powdery liquid crystal polyester (C2).

The liquid crystal polyester (C2) obtained above was heated from room temperature (23° C.) to 180° C. for 1 hour and 20 minutes in a nitrogen atmosphere, further heated from 180° C. to 240° C. for 5 hours, maintained at 240° C. for 5 hours to carry out solid phase polymerization, and cooled, thereby obtaining powdery liquid crystal polyester (C) (LC-C).

LC-D: Liquid crystal polymer produced by production method described below

—Production of LC-D—

941 g (5.0 mol) of 6-hydroxy-2-naphthoic acid, 273 g (2.5 mol) of 4-aminophenol, 415 g (2.5 mol) of isophthalic acid, and 1123 g (11 mol) of acetic acid anhydride were added to a reactor provided with a stirrer, a torque meter, a nitrogen gas introduction pipe, a thermometer, and a reflux condenser, the gas inside the reactor was replaced with nitrogen gas, and the mixture was heated from room temperature (23° C.) to 150° C. over 15 minutes while being stirred in a nitrogen gas stream and was refluxed at 150° C. for 3 hours.

Thereafter, the mixture was heated from 150° C. to 320° C. over 3 hours while distilling off by-product acetic acid and unreacted acetic acid anhydride and maintained until an increase in viscosity was observed, and the resultant was taken out from the reactor and cooled to room temperature. The obtained solid matter was crushed with a crusher, thereby obtaining powdery liquid crystal polyester (D1).

The liquid crystal polyester (D1) obtained above was maintained at 250° C. for 3 hours in a nitrogen atmosphere to carry out solid phase polymerization, cooled, and crushed with a crusher, thereby obtaining powdery liquid crystal polyester (LC-D).

P-1: Mixture of pellets of commercially available polyphenylene ether (SA120, manufactured by SABIC; weight-average molecular weight Mw: 2,600)/bisphenol A-type epoxy resin (EPICLON 850S, manufactured by DIC Corporation; average number of epoxy groups: 2)/bisphenol A-type cyanate ester resin (Badcy, manufactured by LONZA KK.)/aromatic condensed phosphate ester (PX-200, manufactured by DAIHACHI CHEMICAL INDUSTRY CO., LTD.)/tris(diethylphosphinyloxy) aluminum (EXOLIT OP-935, manufactured by CLARIANT Japan)/zinc octoate=25/34/25/8/8/0.01 (mass ratio)

P-2: Commercially available cyclic olefin resin (ARTON F3500, manufactured by JSR Corporation)

<Additive>

[Compound Having Functional Group]

A-1: Mixture shown below Components were mixed with each other such that a solid content in the mixture had a mass ratio shown in Table 1.

CELLOXIDE 2021P (3',4'-epoxycyclohexylmethyl 3,4-epoxycyclohexane carboxylate, manufactured by Daicel Corporation): 100 parts by mass IRGACURE 290 (cationic polymerization initiator, sulfonium salt compound, manufactured by BASF): 3 parts by mass A-2: Compound shown below A component was added such that a solid content had a mass ratio shown in Table 1.

CELLOXIDE 2021P (manufactured by Daicel Corporation): 100 parts by mass

A-3: Compound shown below Components were mixed such that a solid content had a mass ratio shown in Table 1.

2,2'-bis(4-cyanatophenyl)propane (curable compound, manufactured by Tokyo Chemical Industry Co., Ltd.): 100 parts by mass 1-benzyl-2-methylimidazole (manufactured by Mitsubishi Chemical Corporation., BMI12): 10 parts by mass A-4: Commercially available aminophenol-type epoxy resin (jER630LSD, manufactured by Mitsubishi Chemical Corporation.) was used so that the amount of solid content was the amount shown in Table 1.

A-5: Commercially available thermosetting resin (SLK containing mainly a polymer-type curable compound, manufactured by Shin-Etsu Chemical Co., Ltd.) was used so that the amount of solid content was the amount shown in Table 1.

A-6: Mixture of A-4 and F-7 described later (mass ratio: 6:94) was used so that the amount of solid content was the amount shown in Table 1.

A-7: Mixture of bisphenol A-type epoxy resin (EPICLON 850S, manufactured by DIC Corporation; average number of epoxy groups: 2)/bisphenol A-type cyanate ester resin (Badcy, manufactured by LONZA KK.)/aromatic condensed phosphate ester (PX-200, manufactured by DAIHACHI CHEMICAL INDUSTRY CO., LTD.)/tris(diethylphosphinyloxy) aluminum (EXOLIT OP-935, manufactured by CLARIANT Japan)/zinc octoate=45/33/11/11/0.01 (mass ratio)

[Filler]

F-1: Liquid crystal polymer particles produced by production method described below —Production of LC-B—

1034.99 g (5.5 mol) of 2-hydroxy-6-naphthoic acid, 378.33 g (1.75 mol) of 2,6-naphthalenedicarboxylic acid, 83.07 g (0.5 mol) of terephthalic acid, 272.52 g (2.475 mol; 0.225 mol excess with respect to the total molar amount of 2,6-naphthalenedicarboxylic acid and terephthalic acid) of hydroquinone, 1226.87 g (12 mol) of acetic acid anhydride, and 0.17 g of 1-methylimidazole as a catalyst were added to a reactor provided with a stirrer, a torque meter, a nitrogen gas introduction pipe, a thermometer, and a reflux condenser. After the gas in the reactor was replaced with nitrogen gas, the mixture was heated from room temperature to 145° C. over 15 minutes while being stirred in a nitrogen gas stream and was refluxed at 145° C. for 1 hour.

Next, the mixture was heated from 145° C. to 310° C. over 3 hours 30 minutes while distilling off by-product acetic acid and unreacted acetic acid anhydride and maintained at 310° C. for 3 hours, and solid liquid crystal polyester (LC-B) was taken out and cooled to room temperature. A flow start temperature of the polyester (LC-B) was 265° C.

[Production of Liquid Crystal Polyester Particles (F-1)]

Using a jet mill ("KJ-200" manufactured by KURIMOTO Ltd.), the liquid crystal polyester (LC-B) was crushed to obtain liquid crystal polyester particles (F-1). An average particle diameter of the liquid crystal polyester particles was 9 μm.

F-2: Commercially available silica particles having an average particle diameter of 0.5 μm (SO-C2, manufactured by Admatechs) were used so that the amount of solid content was the amount shown in Table 1.

F-3: Solvent of commercially available polytetrafluoroethylene (PTFE) nanoparticles (Polyflon PTFE D-210C, average particle diameter: 0.25 μm, manufactured by DAIKIN INDUSTRIES, LTD.) was replaced with an N-methylpyrrolidone solvent, and used so that the solid content in the polymer film was the amount shown in Table 1.

F-4: Copolymer particles of ethylene tetrafluoride and perfluoroalkoxy ethylene (PFA) (melting point: 280° C., average particle diameter: 0.2 μm to 0.5 μm, dielectric loss tangent: 0.001)

F-5: Commercially available hollow powder having an average particle diameter of 16 μm (glass bubbles iM30K, manufactured by 3M Japan Limited)

F-6: Boron nitride particles (melting point>500° C., HP40MF100 (manufactured by Mizushima Ferroalloy Co., Ltd.), dielectric loss tangent: 0.0007)

F-7: Commercially available ultrahigh-molecular-weight polyethylene particles having an average particle diameter of 10 μm (Mipelon PM200, manufactured by Mitsui Chemicals, Inc.) were used so that the amount of solid content was the amount shown in Table 1.

Examples 1 to 25 and Comparative Example 1

<Film Formation>

The method shown in Table 1 was selected from among the following multilayer coatings A and B and co-casting A to D.

[Multilayer Coating A]

—Preparation of Polymer Solution—

The polymer having a dielectric loss tangent of 0.005 or less, which is shown in Table 1, was added to N-methylpyrrolidone, and the mixture was stirred at 140° C. for 4 hours in a nitrogen atmosphere to form a solution. Thereafter, the additive shown in Table 1 was added to the solution such that the mass ratio was as shown in Table 1, and the mixture was stirred at 25° C. for 30 minutes to obtain a polymer solution. A concentration of solid contents of the polymer solution for the layer A was 10% by mass, and a concentration of solid contents of the polymer solution for the layer B (surface layer) was 7% by mass.

Subsequently, first, the solution was allowed to pass through a sintered fiber metal filter having a nominal pore diameter of 5 μm and allowed to pass through a sintered fiber metal filter having the same nominal pore diameter of 5 μm, thereby obtaining a polymer solution.

In a case where the additive was not dissolved in N-methylpyrrolidone, a liquid crystal polymer solution was prepared without adding the additive, the mixture was allowed to pass through the above-described sintered fiber metal filter, and then the additive was added thereto and stirred.

—Production of Film—

The obtained polymer solution for the layer A and the obtained polymer solution for the layer B were fed to a slot die coater equipped with a slide coater, and applied onto a treated surface of a copper foil (manufactured by FUKUDA METAL FOIL & POWER CO., LTD., CF-T9DA-SV-18, thickness: 18 μm, surface roughness Rz of a surface to be attached (treated surface): 0.85 μm) such that a film having a three-layer configuration (layer B/layer A/layer B) was formed. The polymer solution was dried at 40° C. for 4 hours to remove the solvent from the casting film and obtain a polymer film.

[Multilayer Coating B]

—Preparation of Polymer Solution—

The polymer shown in Table 1 and the additive shown in Table 1 were added to toluene such that the concentration of solid contents was 80%, and the mixture was stirred for 60 minutes to obtain polymer solutions for the layer A and the layer B, respectively.

—Production of Film—

The polymer solutions for the layer A and the layer B were fed to a slot die coater equipped with a slide coater, and applied onto a treated surface of a copper foil (manufactured by FUKUDA METAL FOIL & POWER CO., LTD., CF-T9DA-SV-18, thickness: 18 μm, surface roughness Rz of a treated surface: 0.85 μm) for multilayer coating. After drying at 100° C. for 3 minutes, the coating film was dried at 170° C. for 3 minutes to remove the solvent from the coating film. Thereafter, the temperature was raised from room temperature to 200° C. at 1° C./min, and a heat treatment was performed at the temperature for 2 hours to obtain a polymer film (laminate) having a copper layer.

[Co-Casting A (Solution Film Formation)]

—Preparation of Polymer Solution—

The polymer having a dielectric loss tangent of 0.005 or less, which is shown in Table 1, was added to N-methylpyrrolidone, and the mixture was stirred at 140° C. for 4 hours in a nitrogen atmosphere to form a solution. Thereafter, the additive shown in Table 1 was added to the solution such that the mass ratio was as shown in Table 1, and the mixture was stirred at 25° C. for 30 minutes to obtain a liquid crystal polymer solution. A concentration of solid contents of the solution for the layer A was 23% by mass, and a concentration of solid contents of the solution for the layer B (surface layer) was 20% by mass.

Subsequently, first, the solution was allowed to pass through a sintered fiber metal filter having a nominal pore diameter of 10 μm and allowed to pass through a sintered fiber metal filter having the same nominal pore diameter of 10 μm, thereby obtaining a polymer solution.

—Production of Film—

The obtained polymer solution for the layer A and the obtained polymer solution for the layer B were fed to a casting die equipped with a feedblock adapted for co-casting a three-layer configuration (layer B/layer A/layer B), and cast onto a treated surface of a copper foil (manufactured by FUKUDA METAL FOIL & POWER CO., LTD., CF-T9DA-SV-18, thickness: 18 μm, surface roughness Rz of a surface to be attached (treated surface): 0.85 μm). The polymer solution was dried at 40° C. for 4 hours to remove the solvent from the casting film and obtain a polymer film.

[Co-Casting B (Solution Film Formation)]
—Preparation of Polymer Solution—

The polymer shown in Table 1 was added to N-methylpyrrolidone, and the mixture was stirred at 140° C. for 4 hours in a nitrogen atmosphere to form a solution, and allowed to pass through a sintered fiber metal filter having a nominal pore diameter of 10 μm first and allowed to pass through a sintered fiber metal filter having the same nominal pore diameter of 10 μm again. Subsequently, the additive shown in Table 1 was added so as to have the mass ratio shown in Table 1, and the mixture was stirred at 25° C. for 30 minutes to obtain a polymer solution.

—Production of Film—

The obtained polymer solutions for the layer A, the layer B, and the layer C were fed to a casting die equipped with a multi-manifold adapted for co-casting a three-layer configuration (layer B/layer A/layer C), and cast onto a treated surface of a copper foil (manufactured by FUKUDA METAL FOIL & POWER CO., LTD., CF-T9DA-SV-18, thickness: 18 μm, surface roughness Rz of a surface to be attached (treated surface): 0.85 μm) such that the layer B side was in contact with the copper foil. The polymer solution was dried at 60° C. for 4 hours to remove the solvent from the casting film and obtain a polymer film. In a case where the polymer solution for the layer C was not present, the above-described three-layer configuration was changed to a three-layer configuration (layer B/layer A/layer B).

[Co-Casting C (Solution Film Formation)]

Polymer solutions were prepared in the same manner as in the co-casting B. In addition, after casting in the same manner as in the co-casting B, the solvent was removed from the casting film. Thereafter, the temperature was raised from room temperature (25° C.) to 280° C. at 1° C./min in a nitrogen atmosphere, and a heat treatment was performed at the temperature for 2 hours to obtain a polymer film (laminate) having a copper layer.

[Co-casting D (solution film formation)]
—Preparation of Polymer Solution—

The polymer shown in Table 1 was added to dichloromethane, and the mixture was stirred at 60° C. for 30 minutes to form a solution, and allowed to pass through a sintered fiber metal filter having a nominal pore diameter of 10 μm first and allowed to pass through a sintered fiber metal filter having the same nominal pore diameter of 10 μm again. Subsequently, the additive shown in Table 1 was added so as to have the mass ratio shown in Table 1, and the mixture was stirred at 25° C. for 30 minutes to obtain a polymer solution.

—Production of Film—

The obtained polymer solutions for the layer A and the layer B were fed to a casting die equipped with a multi-manifold adapted for co-casting a three-layer configuration (layer B/layer A/layer B), and cast onto a treated surface of a copper foil (manufactured by FUKUDA METAL FOIL & POWER CO., LTD., CF-T9DA-SV-18, thickness: 18 μm, surface roughness Rz of a surface to be attached (treated surface): 0.85 μm) such that the layer B side was in contact with the copper foil. The casting film was dried at 100° C. for 3 minutes and then dried at 170° C. for 3 minutes to remove the solvent from the casting film, thereby obtaining a polymer film (laminate (layer B/layer A/layer B)).

<Production of Copper-Clad Laminated Plate>

[Film Pretreatment]

With regard to the polymer film containing A-1 as the compound having a functional group, immediately before laminating the copper foil, an air-cooled metal halide lamp (manufactured by Eye Graphics Co., Ltd.) was used to radiate ultraviolet rays at an irradiation amount of 300 mJ/cm$^2$ to polymerize CELLOXIDE 2021P into a polymer.

[Formation of Metal Layer]
—Copper-Clad Laminated Plate Precursor Step—

With regard to the film formed by the multilayer coating, the co-casting A, or the co-casting B, a copper foil (manufactured by FUKUDA METAL FOIL & POWER CO., LTD., CF-T9DA-SV-18, thickness: 18 μm, surface roughness Rz of a surface to be attached (treated surface): 0.85 μm) was placed in contact with the surface of the polymer film, on which the copper layer had not been formed, and using a laminator ("Vacuum laminator V-130" manufactured by Nikko-Materials Co., Ltd.), lamination was performed for 1 minute under conditions of 140° C. and laminating pressure of 0.4 MPa to obtain a copper-clad laminated plate precursor.

—Main Thermocompression Step—

Using a thermocompression machine ("MP-SNL" manufactured by Toyo Seiki Seisaku-sho, Ltd.), the obtained copper-clad laminated plate precursor was subjected to thermocompression under conditions of 300° C. and 4.5 MPa for 10 minutes to produce a copper-clad laminated plate.

—Annealing Step—

With regard to the film of Example 5, after the above-described main thermocompression step, the film was further heated at 250° C. for 3 hours using an oven.

<<Evaluation>>

The produced polymer film was evaluated by the methods described above, and the results are shown in Table 1.

In addition, for each of the produced polymer films, a resin film was laminated instead of the copper foil, and the peel strength was measured.

TABLE 1

| | | Polymer film | | | | | |
|---|---|---|---|---|---|---|---|
| | | Layer B | | | | | |
| | | Polymer | | | Additive | | Thickness |
| | Type | Dielectric loss tangent | Content | | Type | Content | |
| Example1 | LC-A | 0.003 | 50% by mass | | A-1 | 50% by mass | 5 μm |
| Example2 | LC-A | 0.003 | 50% by mass | | A-2 | 50% by mass | 5 μm |
| Example3 | LC-A | 0.003 | 50% by mass | | A-2 | 50% by mass | 5 μm |
| Example4 | LC-A | 0.003 | 50% by mass | | A-2 | 50% by mass | 5 μm |
| Example5 | LC-A | 0.003 | 50% by mass | | A-3 | 50% by mass | 5 μm |
| Comparative | LC-A | 0.003 | 100% by mass | | — | — | 5 μm |

TABLE 1-continued

| Polymer film | | | | | | |
|---|---|---|---|---|---|---|
| example1 | | | | | | |
| Example6 | LC-C | 0.004 | 95% by mass | A-4 | 5% by mass | 5 μm |
| Example7 | LC-C | 0.004 | 95% by mass | A-4 | 5% by mass | 5 μm |
| Example8 | LC-C | 0.004 | 95% by mass | A-4 | 5% by mass | 1 μm |
| Example9 | LC-C | 0.004 | 95% by mass | A-4 | 5% by mass | 3 μm |
| Example10 | L.C-C | 0.004 | 95% by mass | A-4 | 5% by mass | 5 μm |
| Example11 | LC-C | 0.004 | 95% by mass | A-4 | 5% by mass | 3 μm |
| Example12 | LC-C | 0.004 | 95% by mass | A-4 | 5% by mass | 3 μm |
| Example13 | LC-C | 0.004 | 95% by mass | A-5 | 5% by mass | 5 μm |
| Example14 | LC-C | 0.004 | 90% by mass | A-5 | 10% by mass | 5 μm |
| Example15 | LC-C | 0.004 | 75% by mass | A-5 | 25% by mass | 5 μm |
| Example16 | LC-C | 0.004 | 50% by mass | A-5 | 50% by mass | 5 μm |
| Example17 | LC-C | 0.004 | 95% by mass | A-4 | 5% by mass | 5 μm |
| Example18 | LC-C | 0.004 | 95% by mass | A-4 | 5% by mass | 5 μm |
| Example19 | LC-C | 0.004 | 95% by mass | A-4 | 5% by mass | 5 μm |
| Example20 | LC-C | 0.004 | 95% by mass | A-4 | 5% by mass | 5 μm |
| Example21 | LC-C | 0.004 | 95% by mass | A-4 | 5% by mass | 5 μm |
| Example22 | LC-D | 0.004 | 95% by mass | A-4 | 5% by mass | 5 μm |
| Example23 | LC-D | 0.004 | 95% by mass | A-4 | 5% by mass | 5 μm |
| Example24 | P-1 | 0.005 | 50% by mass | A-4 | 50% by mass | 5 μm |
| Example25 | P-2 | 0.002 | 50% by mass | A-7 | 50% by mass | 5 μm |

| | Layer A | | | | | |
|---|---|---|---|---|---|---|
| | Polymer | | | Additive | | Thickness |
| | Type | Dielectric loss tangent | Content | Type | Content | |
| Example1 | LC-A | 0.003 | 100% by mass | — | — | 40 μm |
| Example2 | LC-A | 0.003 | 100% by mass | — | — | 40 μm |
| Example3 | LC-A | 0.003 | 100% by mass | — | — | 40 μm |
| Example4 | LC-A | 0.003 | 50% by mass | A-2 | 50% by mass | 40 μm |
| Example5 | LC-A | 0.003 | 100% by mass | — | — | 40 μm |
| Comparative example1 | LC-A | 0.003 | 100% by mass | — | — | 40 μm |
| Example6 | LC-C | 0.004 | 25% by mass | F-1 | 75% by mass | 45 μm |
| Example7 | LC-C | 0.004 | 25% by mass | F-1 | 75% by mass | 20 μm |
| Example8 | LC-C | 0.004 | 25% by mass | F-1 | 75% by mass | 19 μm |
| Example9 | LC-C | 0.004 | 25% by mass | F-1 | 75% by mass | 42 μm |
| Example10 | LC-C | 0.004 | 25% by mass | F-1 | 75% by mass | 65 μm |
| Example11 | LC-C | 0.004 | 25% by mass | F-1 | 75% by mass | 42 μm |
| Example12 | LC-C | 0.004 | 25% by mass | F-1 | 75% by mass | 42 μm |
| Example13 | LC-C | 0.004 | 25% by mass | F-1 | 75% by mass | 45 μm |
| Example14 | LC-C | 0.004 | 25% by mass | F-1 | 75% by mass | 45 μm |
| Example15 | LC-C | 0.004 | 25% by mass | F-1 | 75% by mass | 45 μm |
| Example16 | LC-C | 0.004 | 25% by mass | F-1 | 75% by mass | 45 μm |
| Example17 | LC-C | 0.004 | 50% by mass | F-2 | 50% by mass | 45 μm |
| Example18 | LC-C | 0.004 | 50% by mass | F-3 | 50% by mass | 45 μm |
| Example19 | LC-C | 0.004 | 50% by mass | F-4 | 50% by mass | 45 μm |
| Example20 | LC-C | 0.004 | 50% by mass | F-5 | 50% by mass | 45 μm |
| Example21 | LC-C | 0.004 | 50% by mass | F-6 | 50% by mass | 45 μm |
| Example22 | LC-C | 0.004 | 25% by mass | F-1 | 75% by mass | 45 μm |
| Example23 | LC-D | 0.004 | 25% by mass | F-1 | 75% by mass | 45 μm |
| Example24 | P-1 | 0.005 | 50% by mass | F-2 | 50% by mass | 45 μm |
| Example25 | P-2 | 0.002 | 100% by mass | — | — | 45 μm |

| | Layer C | | | | | |
|---|---|---|---|---|---|---|
| | Polymer | | | Additive | | Thickness |
| | Type | Dielectric loss tangent | Content | Type | Content | |
| Example1 | — | — | — | — | — | — |
| Example2 | — | — | — | — | — | — |
| Example3 | — | — | — | — | — | — |
| Example4 | — | — | — | — | — | — |
| Example5 | — | — | — | — | — | — |
| Comparative example1 | — | — | — | — | — | — |
| Example6 | — | — | — | — | — | — |
| Example7 | — | — | — | — | — | — |
| Example8 | — | — | — | — | — | — |

TABLE 1-continued

| | Polymer film | | | | | | |
|---|---|---|---|---|---|---|---|
| Example9 | LC-C | 0.004 | 95% by mass | A-4 | 5% by mass | 3 μm | |
| Example10 | LC-C | 0.004 | 95% by mass | A-4 | 5% by mass | 5 μm | |
| Example11 | LC-C | 0.004 | 95% by mass | A-4 | 80% by mass | 20 μm | |
| Example12 | LC-C | 0.004 | 95% by mass | A-4 | 80% by mass | 36 μm | |
| Example13 | — | — | — | — | — | — | |
| Example14 | — | — | — | — | — | — | |
| Example15 | — | — | — | — | — | — | |
| Example16 | — | — | — | — | — | — | |
| Example17 | — | — | — | — | — | — | |
| Example18 | — | — | — | — | — | — | |
| Example19 | — | — | — | — | — | — | |
| Example20 | — | — | — | — | — | — | |
| Example21 | — | — | — | — | — | — | |
| Example22 | — | — | — | — | — | — | |
| Example23 | — | — | — | — | — | — | |
| Example24 | — | — | — | — | — | — | |
| Example25 | — | — | — | — | — | — | |

| | Evaluation result | | |
|---|---|---|---|
| | Film formation tangent | Polymer film Dielectric loss tangent | Laminate Peel strength |
| Example1 | Multilayer coating A | 0.004 | 1.2 kN/m |
| Example2 | Multilayer coating A | 0.003 | 1.2 kN/m |
| Example3 | Co-casting A | 0.003 | 1.2 kN/m |
| Example4 | Multilayer coating A | 0.01 | 1.2 kN/m |
| Example5 | Multilayer coating A | 0.003 | 1.1 kN/m |
| Comparative example1 | Multilayer coating A | 0.003 | 0.3 kN/m |
| Example6 | Co-casting B | 0.002 | 0.9 kN/m |
| Example7 | Co-casting B | 0.003 | 0.9 kN/m |
| Example8 | Co-casting B | 0.002 | 0.6 kN/m |
| Example9 | Co-casting C | 0.003 | 0.8 kN/m |
| Example10 | Co-casting C | 0.002 | 0.9 kN/m |
| Example11 | Co-casting B | 0.002 | |
| Example12 | Co-casting C | 0.002 | 0.8 kN/m |
| Example13 | Co-casting B | 0.002 | 0.9 kN/m |
| Example14 | Co-casting B | 0.002 | 1.0 kN/m |
| Example15 | Co-casting B | 0.002 | 1.1 kN/m |
| Example16 | Co-casting B | 0.002 | 1.2 kN/m |
| Example17 | Co-casting B | 0.002 | 0.9 kN/m |
| Example18 | Co-casting B | 0.002 | 0.9 kN/m |
| Example19 | Co-casting B | 0.002 | 0.9 kN/m |
| Example20 | Co-casting B | 0.001 | 0.9 kN/m |
| Example21 | Co-casting B | 0.002 | 0.9 kN/m |
| Example22 | Co-casting B | 0.002 | 0.9 kN/m |
| Example23 | Co-casting B | 0.002 | 1.0 kN/m |
| Example24 | Multilayer coating B | 0.003 | 1.2 kN/m |
| Example25 | Co-casting D | 0.002 | 0.9 kN/m |

From the results shown in Table 1, the polymer films of Examples 1 to 25, which are the polymer film according to the embodiment of the present disclosure, were excellent in adhesiveness with the metal layer than the polymer film of Comparative Example 1.

In addition, from the results shown in Table 1, the polymer films of Examples 1 to 25, which are the polymer film according to the embodiment of the present disclosure, were a polymer film having a low dielectric loss tangent.

In addition, the polymer films of Examples 1 to 25, that are the polymer film according to the embodiment of the present disclosure in which the resin film was laminated instead of the copper foil, were excellent in adhesiveness with the resin film than the polymer film of Comparative Example 1.

What is claimed is:

1. A polymer film comprising:
a layer A; and
a layer B on at least one surface of the layer A,
wherein the layer B contains a polymer having a dielectric loss tangent of 0.005 or less with a measurement frequency of 10 GHz and a compound having a functional group, and
the functional group is at least one group selected from the group consisting of a covalent-bondable group, an ion-bondable group, a hydrogen-bondable group, a dipole-interactable group, and a curing reactive group,
the compound having the functional group is a compound which interacts with, is bonded to, or forms an entanglement with the polymer having the dielectric loss tangent of 0.005 or less, the polymer having the dielectric loss tangent of 0.005 or less with the measurement frequency of 10 GHz and the compound having the functional group are compatible with each other, a difference between an SP value of the polymer having the dielectric loss tangent of 0.005 or less, which is determined by Hoy method, and an SP value of the compound having the functional group, which is determined by the Hoy method, is 5 $MPa^{0.5}$ or less.

2. The polymer film according to claim 1,
wherein a melting point Tm or a 5%-by-mass-loss temperature Td of the polymer having the dielectric loss tangent of 0.005 or less is 200° C. or higher.

3. The polymer film according to claim 1,
wherein the polymer having the dielectric loss tangent of 0.005 or less is at least one polymer selected from the group consisting of a liquid crystal polymer, a fluorine-based polymer, a polymerized substance of a compound which has a cyclic aliphatic hydrocarbon group and a group having an ethylenically unsaturated bond, a polyphenylene ether, and an aromatic polyether ketone.

4. The polymer film according to claim 1,
wherein the polymer having the dielectric loss tangent of 0.005 or less is a liquid crystal polymer having a constitutional unit represented by any of Formulae (1) to (3), —O-$Ar^1$-CO—                                           Formula (1)

—CO-$Ar^2$-CO—                                       Formula (2)

—X-$Ar^3$-Y—                                               Formula (3)

in Formulae (1) to (3), $Ar^1$ represents a phenylene group, a naphthylene group, or a biphenylylene group, $Ar^2$ and $Ar^3$ each independently represent a phenylene group, a naphthylene group, a biphenylylene group, or a group represented by Formula (4), X and Y each independently represent an oxygen atom or an imino group, and hydrogen atoms in $Ar^1$ to $Ar^3$ may be each independently substituted with a halogen atom, an alkyl group, or an aryl group, -$Ar^4$-Z-$Ar^5$-                                        Formula (4)

in Formula (4), $Ar^4$ and $Ar^5$ each independently represent a phenylene group or a naphthylene group, and Z represents an oxygen atom, a sulfur atom, a carbonyl group, a sulfonyl group, or an alkylene group.

5. The polymer film according to claim 1,
wherein the functional group is a covalent-bondable group.

6. The polymer film according to claim 1,
wherein the polymer film contains a cured substance of a polyfunctional reactive compound.

7. The polymer film according to claim 1,
wherein the compound having the functional group is a polymer having a functional group.

8. The polymer film according to claim 7,
wherein the polymer having the functional group is a polymerizable liquid crystal polymer.

9. The polymer film according to claim 1, further comprising:
a layer C,
wherein the layer B, the layer A, and the layer C are provided in this order.

10. A laminate comprising:
the polymer film according to claim 1; and
a metal layer disposed on at least one surface of the polymer film.

11. The laminate according to claim 10,
wherein a surface roughness Rz of the metal layer on a side in contact with the polymer film is 5 μm or less.

12. The laminate according to claim 10,
wherein the metal layer is a copper layer, and
a peel strength between the polymer film and the copper layer is 0.5 kN/m or more.

13. The laminate according to claim 12,
wherein the copper layer has an interactable group with the polymer film on a surface of a side in contact with the polymer film.

14. The laminate according to claim 13,
wherein the interactable group is an amino group.

* * * * *